US006984880B2

(12) United States Patent
Minamio et al.

(10) Patent No.: US 6,984,880 B2
(45) Date of Patent: Jan. 10, 2006

(54) LEADFRAME, RESIN-MOLDED SEMICONDUCTOR DEVICE INCLUDING THE LEADFRAME, METHOD OF MAKING THE LEADFRAME AND METHOD FOR MANUFACTURING THE DEVICE

(75) Inventors: Masanori Minamio, Osaka (JP); Fumihiko Kawai, Kyoto (JP); Masahiko Ohiro, Shiga (JP); Masanori Koichi, Niigata (JP); Yoshinori Satoh, Niigata (JP); Akira Oga, Shiga (JP); Toshiyuki Fukuda, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/702,603

(22) Filed: Nov. 7, 2003

(65) Prior Publication Data

US 2004/0094829 A1 May 20, 2004

Related U.S. Application Data

(62) Division of application No. 09/971,731, filed on Oct. 9, 2001, now Pat. No. 6,720,207.

(30) Foreign Application Priority Data

Feb. 14, 2001 (JP) .............................. 2001-037484
Feb. 14, 2001 (JP) .............................. 2001-037496

(51) Int. Cl.
*H01L 23/495* (2006.01)
*H01L 23/28* (2006.01)
(52) U.S. Cl. ...................... 257/676; 257/666; 257/670; 257/787
(58) Field of Classification Search ................ 257/666, 257/676, 670, 787
See application file for complete search history.

(56) References Cited

U.S. PATENT DOCUMENTS

| 5,637,913 | A | * | 6/1997 | Kajihara et al. | ............ 257/666 |
| 5,834,837 | A | * | 11/1998 | Song | ........................ 257/692 |
| 5,977,615 | A | * | 11/1999 | Yamaguchi et al. | ........ 257/666 |
| 6,225,146 | B1 | * | 5/2001 | Yamaguchi et al. | ........ 438/123 |

FOREIGN PATENT DOCUMENTS

| JP | 09-008206 | 1/1997 |
| JP | 10-200010 A | 7/1998 |
| JP | 10-270623 A | 10/1998 |
| JP | 2000-183226 A | 6/2000 |
| JP | 2000-223611 A | 8/2000 |
| JP | 2001-345411 A | 12/2001 |
| JP | 2001-345413 A | 12/2001 |
| JP | 2002-076232 | 3/2002 |
| TW | 384531 | 3/2000 |

OTHER PUBLICATIONS

Notice of Reasons of Rejection (Dated Jun. 24, 2003) Corresponds to JP 2001-037484.
Notice of Reasons of Rejection (Dated Jun. 24, 2003) Corresponds to JP 2001-037496.
Korean Office Action Dated Mar. 21, 2003.

* cited by examiner

*Primary Examiner*—Nathan J. Flynn
*Assistant Examiner*—Victor A. Mandala, Jr.
(74) *Attorney, Agent, or Firm*—Donald R. Studebaker; NixonPeabody, LLP

(57) ABSTRACT

A leadframe includes: a frame rail; a die pad, disposed inside the frame rail, for mounting a semiconductor chip thereon; and a plurality of internal inner leads, which are disposed to surround the die pad and each of which has a convex portion on the bottom thereof. The frame rail and the internal inner leads are retained by a lead retaining member on their upper and/or lower surface(s).

4 Claims, 13 Drawing Sheets

LEADFRAME, RESIN-MOLDED SEMICONDUCTOR DEVICE INCLUDING THE LEADFRAME, METHOD OF MAKING THE LEADFRAME AND METHOD FOR MANUFACTURING THE DEVICE

BACKGROUND OF THE INVENTION

The present invention relates to a leadframe as a land grid array (LGA) in which multiple lands are arranged in columns and rows of external terminals exposed on the bottom of a package. This invention also relates to a resin-molded semiconductor device including the leadframe, a method of making the leadframe and a method for manufacturing the device.

In recent years, to catch up with rapidly advancing downsizing and performance enhancement of electronic units, it has become increasingly necessary to assemble semiconductor components at a higher and higher density. To meet this demand, a resin-molded semiconductor device, formed by molding a semiconductor chip and leads together with a resin encapsulant, has its size and thickness reduced noticeably. In parallel with this downsizing trend, the number of pins required for a single electronic unit is also increasing day after day.

Hereinafter, a known leadframe for use in a resin-molded semiconductor device will be described with reference to the drawings.

FIG. 12 illustrates a plan view of a known leadframe. The leadframe 100 shown in FIG. 12 is for use in a quad flat package (QFP) in which external pins extend outward from the four side faces of a rectangular parallelepiped package. As shown in FIG. 12, the leadframe 100 includes frame rail 101, rectangular die pad 102, inner leads 103 and outer leads 104. The die pad 102 is located at the center of the frame rail 101. The inner end of each inner lead 103 faces an associated side of the die pad 102 and the respective inner ends of the inner leads 103 are spaced apart from the sides of the die pad 102. The inner end of each outer lead 104 is connected to the outer end of the associated inner lead 103 while the outer end of each outer lead 104 is connected to the frame rail 101. The outer leads 104 are joined together by a tie bar 105 for preventing the overflow of a resin encapsulant during a resin molding process. And the die pad 102 is supported at the four corners by support pins 106 that are connected to the tie bar 105.

In FIG. 12, the members existing inside the dashed-line region 109 will be molded together by a resin encapsulant. Although just a part of the leadframe 100 for one device is illustrated in FIG. 12, the leadframe 100 actually has many other parts that each have the pattern shown in FIG. 12 and that are arranged in columns and rows.

FIG. 13 illustrates a cross-sectional structure for a resin-molded semiconductor device including the leadframe 100. In FIG. 13, each component also shown in FIG. 12 is identified by the same reference numeral.

As shown in FIG. 13, a semiconductor chip 107 is bonded onto the die pad 102 using some adhesive or solder. The semiconductor chip 107 is electrically connected to the inner leads 103 using metal fine wires 108. The die pad 102, semiconductor chip 107 on the die pad 102, metal fine wires 108 and inner leads 103 are molded together with a resin encapsulant 109A. In this case, the bottom of the die pad 102 is completely buried in the resin encapsulant 109A. The outer leads 104 extend outward from the side faces of the resin encapsulant 109A parallelly to the surface of the die pad 102 on which the chip 107 has been mounted. Also, the outer leads 104 have been bent downward so that this package can be surface-mounted onto a motherboard.

As described above, the number of components that should be integrated together within a single semiconductor chip 107, or the number of external electrodes (or pins) per chip, has been on the rise these days. Thus, the number of outer leads 104 should also be increased to catch up with this latest trend. That is to say, the number of inner leads 103, which are joined to the outer leads 104, should also be increased to cope with such an implementation. However, the width of the inner (or outer) leads 103 or 104 has a patternable limit. Accordingly, if the number of inner (or outer) leads 103 or 104 was further increased, the overall size of the leadframe 100 should also increase. This is not allowable because the increase in size of the leadframe 100 is incompatible with the recent downsizing trend. On the other hand, if the width of the inner or outer leads 103 or 104 were reduced, then it would be much more difficult to form the leadframe 100 in its desired shape.

To cope with these problems, face-bonded semiconductor devices, such as ball grid array (BGA) and land grid array (LGA) types, are also available recently. In semiconductor devices of these types, a semiconductor chip is mounted onto the non-circuitry side of a carrier (e.g., a printed wiring board), including ball or land electrodes on its back surface, and is electrically connected to these electrodes.

A semiconductor device of the BGA or LGA type is then mounted onto a motherboard so that its back surface faces the principal surface of the motherboard. And then the external electrodes (i.e., the ball or land electrodes), exposed on the back surface of the device, are directly connected electrically to the electrodes on the motherboard.

The BGA- or LGA-type semiconductor device, however, uses a multilayer carrier (or wiring board) in which ceramic or plastic layers have been stacked. Accordingly, the fabrication process thereof is overly complicated and the fabrication cost thereof is far from reasonable.

Also, it is hard to apply a method for manufacturing the known resin-molded semiconductor device shown in FIGS. 12 and 13 as it is to forming a semiconductor device of the BGA or LGA type. The reason is as follows. In the manufacturing process, part of a metal plate, including portions to be lands as external electrodes, should be connected to the frame rail with some joining/supporting members before the lands are formed. Accordingly, where lands should be arranged in three or more rows, the device of the BGA- or LGA-type device cannot be so small.

In addition, according to the method for manufacturing the known resin-molded semiconductor device shown in FIGS. 12 and 13, the device cannot be mounted onto the motherboard so accurately as in manufacturing a face-bonded semiconductor device of the BGA or LGA type. As described above, the beamlike outer leads 104 shown in FIG. 12 extend linearly outward from the sides of the resin encapsulant 109A just after the members of the device have been molded. Accordingly, the outer leads 104 should be bent downward so that the far end of each outer lead 104 has its bottom located at least no higher than the back surface of the resin encapsulant 109A. And in this bending process step, the outer leads 104 cannot be bent so uniformly and the far ends of the outer leads 104 are likely located at various levels.

SUMMARY OF THE INVENTION

It is therefore an object of the present invention to make a smaller leadframe, including lands arranged in multiple (three or more, in particular) rows, out of a single-layer metal plate easily enough to manufacture a downsized resin-molded semiconductor device using the leadframe.

To achieve this object, according to the present invention, a plurality of lands are arranged in columns and rows between a frame rail and a die pad, and the lands and frame rail get retained by a lead retaining member on the upper and/or lower surface(s) thereof.

Specifically, a first inventive leadframe includes: a frame rail; a die pad, disposed inside the frame rail, for mounting a semiconductor chip thereon; and a plurality of internal inner leads, which are disposed to surround the die pad and each of which has a convex portion on the bottom thereof. The frame rail and the internal inner leads are retained by a lead retaining member on their upper and/or lower surface(s).

In the first leadframe, the internal inner leads, each having a convex portion to be an external terminal (i.e., land) on its bottom, and the frame rail are retained by a lead retaining member on their upper and/or lower surface(s). Accordingly, the internal inner leads do not have to be supported by the frame rail. That is to say, there is no need to provide-any joining/supporting member for joining the internal inner leads and the frame rail together. For that reason, even if the lands are arranged in three or more rows between the frame rail and the die pad, the frame rail still can be formed in a smaller size. Thus, a downsized leadframe, including lands arranged in multiple rows, can be made out of a single-layer metal plate easily.

In one embodiment of the first leadframe, at least some of the internal inner leads preferably have their convex portions insolated from each other. And each said isolated convex portion is preferably surrounded with an elevated (or burred) portion, which extends vertically to the bottom of the internal inner lead, so that the top of the elevated portion is lower than the top of the convex portion. Suppose the internal inner lead portions are supported by joining/supporting members extending from the die pad in an early stage of a leadframe manufacturing process. And if the burred portions, which will be formed when the joining/supporting members are cut off with a stamper (or die punch) in a subsequent process step, have their top positioned lower than that of the convex portions, then only the top of the convex portions will be exposed out of the resin encapsulant at the molding process step. Accordingly, the leakage current can be eliminated and a semiconductor device including the first inventive leadframe will not operate erroneously.

In another embodiment, the first leadframe preferably further includes a plurality of external inner leads, which are disposed between the frame rail and the internal inner leads to extend inward from the frame rail and each of which has a convex portion on the bottom thereof. Then, a leadframe, including lands arranged in multiple rows, can be formed just as intended.

A second inventive leadframe includes: a frame rail; a die pad, disposed inside the frame rail, for mounting a semiconductor chip thereon; and a plurality of inner leads disposed between the frame rail and the die pad. The frame rail and the inner leads are retained by a lead retaining member on their upper and/or lower surface(s). Each of the inner leads has a convex portion on the bottom thereof. The convex portions are spaced apart from each other. And at least some of the convex portions are isolated from adjacent ones of the convex portions, while the other convex portions are supported by joining/supporting members.

In the second leadframe, the frame rail and the inner leads are retained by the lead retaining member on their upper and/or lower surface(s). Accordingly, the isolated convex portions to be lands do not have to be supported by the frame rail. That is to say, there is no need to provide the joining/supporting members for joining the inner leads, each including the isolated convex portion, and the frame rail together. For that reason, even if the lands are arranged in three or more rows between the frame rail and the die pad, the frame rail still can be formed in a smaller size. Thus, a downsized leadframe, including lands arranged in multiple rows, can be made out of a single-layer metal plate easily.

In one embodiment of the second leadframe, each said isolated convex portion is preferably surrounded with an elevated portion, which extends vertically to the bottom of the inner lead, so that the top of the elevated portion is lower than the top of the convex portion.

In another embodiment of the first or second leadframe, the die pad preferably has a concave portion on the bottom thereof. Then, water much less likely enters the resin encapsulant because the chip is more distant from the bottom of the resin encapsulant. In addition, the stress applied downward onto the chip from over the resin encapsulant can also be reduced because the resin, protecting the chip from under its bottom, increases its thickness.

A third inventive leadframe includes: a frame rail; a die pad, disposed inside the frame rail, for mounting a semiconductor chip thereon; a plurality of lands disposed between the frame rail and the die pad; and a plurality of inner leads for electrically connecting some of the lands together. The frame rail and the lands are retained by a lead retaining member on the upper and/or lower surface(s) thereof. Each said inner lead connects associated ones of the lands together between two adjacent ones of the lands. The top of the inner lead is almost as high as the top of the two adjacent lands, while the bottom of the inner lead is higher than the bottom of the two adjacent lands. And when taken vertically to a direction in which the inner leads extend, each said land has such a cross-sectional shape that an upper part of the land, each side face of which faces a side face of associated one of the inner leads, has a decreased width.

In the third leadframe, the inner leads, each connecting associated ones of the lands together between two adjacent ones of the lands, are provided. But each of the lands has a cross-sectional shape with an upwardly decreasing width. Accordingly, each of the inner leads is located between the respective upper parts of the two adjacent lands with the decreased width. That is to say, the space between the side faces of the two adjacent lands is greater in the upper part thereof than in the lower part thereof. For that reason, the inner leads can be disposed between the lands without reducing the size of the lands or the width of the inner leads.

A first inventive leadframe making method includes the step of a) forming a frame rail, a die pad, multiple internal inner lead portions and multiple external inner lead portions out of a single metal plate. The die pad is supported by joining/supporting members that extend inward from the frame rail. The internal inner lead portions are connected to the die pad so as to surround the die pad. And the external inner lead portions are connected to the frame rail. The method further includes the step of b) forming convex portions in respective parts of the internal and external inner lead portions so that each said convex portion formed in that part of associated one of the internal inner lead portions is spaced apart from the die pad and that each said convex portion formed in that part of associated one of the external inner lead portions is spaced apart from the frame rail. The convex portions are formed on respective surfaces of the internal and external inner lead portions opposite to a surface of the die pad on which a chip will be mounted. The method further includes the step of c) placing a lead retaining member on respective surfaces of at least the internal inner lead portions and the frame rail and thereby getting the internal inner lead portions and the frame rail retained by the retaining member. The surfaces on which the retaining member is placed are either the same as, or opposite to, the surface of the die pad on which the chip will be mounted. And the method further includes the step of d) removing, from at least some of the internal inner lead portions, respective parts thereof located between the convex portions and the die pad, thereby forming internal inner leads that have been selectively isolated from the die pad.

In the first leadframe making method, at least the internal inner lead portions and the frame rail are retained by the lead retaining member on their respective surfaces that are the same as, or opposite to, the surface of the die pad on which the chip will be mounted. Accordingly, even if the internal inner lead portions are selectively isolated from the die pad after that by a cutting or etching process, the isolated internal inner leads will not drop off from the frame rail. Thus, the first leadframe of the present invention, for which no joining/supporting members are needed to join and support the internal inner leads and the frame rail together, can be obtained.

In one embodiment of the first leadframe making method, the convex portions may be formed in the step b) by etching away a part of the metal plate located between the part of each said internal inner lead portion in which the associated convex portion will be formed and the die pad and another part of the metal plate located between the part of each said external inner lead portion in which the associated convex portion will be formed and the frame rail. Those parts may be etched away from a surface of the metal plate opposite to the surface of the die pad on which the chip will be mounted. Then, the convex portions to be the lands can be formed in a desired small size.

In an alternative embodiment, the convex portions may be formed in the step b) by pressing a part of the metal plate located between the part of each said internal inner lead portion in which the associated convex portion will be formed and the die pad and another part of the metal plate located between the part of each said external inner lead portion in which the associated convex portion will be formed and the frame rail. Those parts may be pressed on a surface of the metal plate opposite to the surface of the die pad on which the chip will be mounted. Then, the convex portions to be the lands can be easily formed just as intended.

In still another embodiment, the convex portions may be isolated in the step d) from the die pad by cutting off the respective parts of the internal inner lead portions located between the convex portions and the die pad using cutting means. Then, the convex portions can be isolated from the die pad easily and the lands can be formed as the convex portions that have been isolated from each other.

A second inventive leadframe making method includes the step of a) forming a frame rail, multiple inner lead portions and a die pad out of a single metal plate. The inner lead portions are supported by a first group of joining/supporting members that extend inward from the frame rail, and are joined together by a second group of joining/supporting members. The method further includes the step of b) forming convex portions on a surface of the inner lead portions so that the convex portions are spaced apart from each other. The surface is opposite to a surface of the die pad on which a chip will be mounted. The method further includes the step of c) placing a lead retaining member on respective surfaces of the inner lead portions and the frame rail and thereby getting the inner lead portions and the frame rail retained by the retaining member. The surfaces on which the retaining member is placed may be either the same as, or opposite to, the surface of the die pad on which the chip will be mounted. And the method further includes the step of d) selectively isolating the inner lead portions by removing, from at least some of the joining/supporting members of the second group for the inner lead portions, respective parts thereof located between adjacent ones of the convex portions or between one of the convex portions and the die pad that are adjacent to each other.

In the second leadframe making method, the inner lead portions and the frame rail are retained by the lead retaining member on their respective surfaces that are the same as, or opposite to, the surface of the die pad on which the chip will be mounted. Accordingly, even if the inner lead portions are selectively isolated from the die pad after that by a cutting or etching process, the isolated inner leads or die pad will not drop off from the frame rail. Thus, the second leadframe of the present invention, for which no joining/supporting members are needed to join and support the inner leads, die pad and frame rail together, can be obtained.

In one embodiment of the second leadframe making method, the convex portions may be formed in the step b) by etching away a part of each said joining/supporting member of the second group. The part to be etched may be located either between the parts of the associated inner lead portions where the convex portions will be formed or between the part of the associated inner lead portion where the convex portion will be formed and the die pad. Also, the part may be etched away from a surface of the joining/supporting members of the second group opposite to the surface of the die pad on which the chip will be mounted.

In an alternative embodiment, the convex portions may be formed in the step b) by pressing a part of each said joining/supporting member of the second group. The part to be pressed may be located either between the parts of the associated inner lead portions where the convex portions will be formed or between the part of the associated inner lead portion where the convex portion will be formed and the die pad. Also, the part may be pressed on a surface of the joining/supporting members of the second group opposite to the surface of the die pad on which the chip will be mounted.

In still another embodiment, a part of each selected joining/supporting member of the second group, which part is located either between associated ones of the convex portions or between associated one of the convex portions and the die pad, may be cut off in the step d) with cutting means, thereby isolating the convex portions from each other or from the die pad.

In yet another embodiment of the first or second leadframe making method, the cutting means preferably has a cut face, which is substantially parallel to respective upper surfaces of the convex portions and the die pad. Then, no burred portion will be formed around the convex portion, for example. Also, if the joining/supporting members are cut off by a punching process like this, then some debris will be made. However, if the debris is received by the lead retaining member, the debris will not affect the manufacturing process.

A third inventive leadframe making method includes the step of a) forming a frame rail, lands, inner leads and a die pad out of a single metal plate. The lands are supported by joining/supporting members extending inward from the frame rail and are joined together so as to be spaced apart from each other. The inner leads electrically connect some of the lands together. And the die pad has a surface on which a chip will be mounted. The method further includes the step of b) placing a lead retaining member on respective surfaces of the lands and the frame rail and thereby getting the lands and the frame rail retained by the retaining member. The surfaces on which the retaining member is placed may be either the same as, or opposite to, the surface of the die pad on which the chip will be mounted. The method further includes the step of c) removing, from at least some of the joining/supporting members, respective parts thereof located between adjacent ones of the lands, thereby selectively isolating the lands.

In the third leadframe making method, the lands and frame rail are retained by the lead retaining member on their upper and/or lower surface(s). Accordingly, even if the resultant leadframe includes not only the lands but also the inner leads for electrically connecting some of the lands together, neither the lands nor the inner leads will drop off from the frame rail. Thus, a small-sized leadframe, including lands arranged in multiple rows, can be easily made out of a single-layer metal plate.

In one embodiment of the third leadframe making method, the step a) preferably includes the step of forming the inner leads out of the joining/supporting members between the lands by etching away respective parts of the metal plate from a surface thereof, on which the chip will be mounted, to approximately half the thickness of the metal plate while masking other parts of the metal plate that will be respective center portions of the lands extending in parallel to the associated joining/supporting member and also masking still other parts of the metal plate that will be the inner leads located between the associated lands. The step a) preferably further includes the step of etching away yet other parts of the metal plate from another surface thereof, opposite to the surface on which the chip will be mounted, while those parts of the metal plate to be the lands masked on the opposite surface so that the lands and the inner leads are isolated from each other.

Then, each of the lands will have a cross-sectional shape with an upwardly decreasing width and each of the inner leads, formed between adjacent lands, will have its top positioned approximately as high as that of the lands and its bottom positioned higher than that of the lands. Thus, the third inventive leadframe can be formed just as intended.

A first inventive resin-molded semiconductor device includes: a die pad; a semiconductor chip bonded onto the die pad; a plurality of inner leads, which are arranged in three or more columns and rows between the die pad and one side of the device to surround the die pad and at least some of which are isolated; and a resin encapsulant that molds the chip, the die pad and the inner leads together so as to expose a surface of the inner leads opposite to a surface of the die pad onto which the chip has been bonded. The die pad and the inner leads are made of a single metal plate.

The first resin-molded semiconductor device can be formed using a leadframe that has been shaped out of a single-layer metal plate to include lands arranged in multiple (e.g., three or more, in particular) rows.

In one embodiment of the first device, each said inner lead preferably has a convex portion on the bottom thereof. The top of the convex portion is preferably exposed out of the resin encapsulant. An elevated portion, extending vertically to the bottom of the inner lead so that the top of the elevated portion is lower than the top of the convex portion, is preferably formed around the convex portion. Suppose the inner lead portions are supported by joining/supporting members extending from the frame rail in an early stage of a leadframe manufacturing process. Even so, in this device, the burred portions, which will be formed when the joining/supporting members are cut off with a stamper (or die punch) in a subsequent process step, should have their top positioned lower than that of the convex portions. Accordingly, only the top of the convex portions will be exposed out of the resin encapsulant at the molding process step.

In another embodiment of the first device, the die pad preferably has a concave portion on the bottom thereof. Then, water much less likely enters the resin encapsulant because the chip is more distant from the bottom of the resin encapsulant. In addition, the stress applied downward onto the chip from over the resin encapsulant can also be reduced because the resin, protecting the chip from under its bottom, increases its thickness.

In still another embodiment, none of the inner leads should be exposed out of the side faces of the resin encapsulant. Then, the leakage current, which otherwise might flow through the side faces of this resin-molded semiconductor device when the device is mounted onto a motherboard, can be eliminated.

A second inventive resin-molded semiconductor device includes: a die pad; a semiconductor chip bonded onto the die pad; a plurality of lands disposed around the die pad, at least some of the lands being isolated; a plurality of inner leads, disposed around the die pad, for electrically connecting some of the lands together; and a resin encapsulant that molds the chip, the die pad, the lands and the inner leads together so as to expose a surface of the lands opposite to a surface of the die pad onto which the chip has been bonded. Each said inner lead connects associated ones of the lands together between two adjacent ones of the lands. The top of the inner lead is almost as high as the top of the two adjacent lands, while the bottom of the inner lead is higher than the bottom of the two adjacent lands. And when taken vertically to a direction in which the inner leads extend, each said land has such a cross-sectional shape that an upper part of the land, each side face of which faces a side face of associated one of the inner leads, has a decreased width.

In the second resin-molded semiconductor device, each of the inner leads is located between the respective upper parts of the two adjacent lands with the decreased width. That is to say, the space between the side faces of the lands is greater in the upper parts thereof than in the lower parts thereof. For that reason, the inner leads can be disposed between the lands without reducing the size of the lands or the width of the inner leads.

A first inventive method for manufacturing a resin-molded semiconductor device includes the step of a) forming frame rails, die pads and multiple sets of internal and external inner lead portions out of a single metal plate. Each said die pad is supported by joining/supporting members that extend inward from associated one of the frame rails. Each said set of internal inner lead portions are connected to associated one of the die pads so as to surround the die pad. And each said set of external inner lead portions are connected to associated one of the frame rails. The method further includes the step of b) forming convex portions in respective parts of the internal and external inner lead portions so that each said convex portion formed in that part of associated one of the internal inner lead portions is spaced apart from the associated die pad and that each said convex portion formed in that part of associated one of the external inner lead portions is spaced apart from the associated frame rail. The convex portions are formed on respective surfaces of the internal and external inner lead portions opposite to an upper surface of the die pads on which semiconductor chips will be bonded. The method further includes the step of c) placing a lead retaining member on respective surfaces of at least the internal inner lead portions and the frame rails and thereby getting the internal inner lead portions and the frame rails retained by the retaining member. The surfaces on which the retaining member is placed may be either the same as, or opposite to, the upper surface of the die pads on which the chips will be bonded. The method further includes the step of d) removing, from at least some of the internal inner lead portions, respective parts thereof located between the convex portions and the associated die pads, thereby forming internal inner leads that have been selectively isolated from the die pads and obtaining a leadframe with the lead retaining member. The method further includes the steps of: e) bonding the chips onto the upper surface of the die pads of the leadframe; and f) electrically connecting the chips to the isolated internal inner leads and the external inner lead portions using metal fine wires. If the lead retaining member has been placed on the surface of the leadframe on which the chips have been bonded, the method further includes the step of g) removing the lead retaining member from the surface of the leadframe on which the chips have been bonded. The method further includes the step of h) molding the chips, the die pads, the internal inner leads and the external inner lead portions together with a resin encapsulant so that the convex portions of the internal inner leads and the external inner lead portions have their top exposed. If the lead retaining member has been placed on another surface of the leadframe opposite to the surface thereof on which the chips have been bonded, the method further includes the step of i) removing the lead retaining member from the opposite surface of the leadframe. And the method further includes the step of j) dividing the leadframe, along with the members assembled thereon, into multiple packages so that each said package includes at least one of the chips.

According to the first inventive manufacturing method, the first inventive resin-molded semiconductor device can be formed just as intended by using the first inventive leadframe.

In one embodiment of the first manufacturing method, the convex portions may be formed in the step b) by etching away a part of the metal plate located between the part of each said internal inner lead portion in which the associated convex portion will be formed and the associated die pad and another part of the metal plate located between the part of each said external inner lead portion in which the associated convex portion will be formed and the associated frame rail. Those parts may be etched away from a surface of the metal plate opposite to the surface of the leadframe on which the chips will be bonded. Then, the convex portions to be the lands can be formed in a desired small size.

In an alternative embodiment, the convex portions may be formed in the step b) by pressing a part of the metal plate located between the part of each said internal inner lead portion in which the associated convex portion will be formed and the associated die pad and another part of the metal plate located between the part of each said external inner lead portion in which the associated convex portion will be formed and the associated frame rail. Those parts may be pressed on a surface of the metal plate opposite to the surface of the leadframe on which the chips will be bonded. Then, the convex portions to be the lands can be easily formed just as intended.

In still another embodiment, the convex portions may be isolated in the step d) from the die pads by cutting off the respective parts of the internal inner lead portions located between the convex portions and the die pads using cutting means. Then, the convex portions can be isolated from the die pads easily and the lands can be formed as the convex portions that are isolated from each other.

In this particular embodiment, the cutting means preferably has a cut face, which is substantially parallel to respective upper surfaces of the convex portions and the die pads. Then, no burred portion will be formed around the convex portion, for example. Also, if the joining/supporting members are cut off by a punching process like this, then some debris will be made. However, if the debris is received by the lead retaining member, the debris will not affect the manufacturing process.

In yet another embodiment, the lead retaining member may be chemically dissolved and removed in the step g) or i). Then, the lead retaining member is removable nonmechanically, thus simplifying the manufacturing process.

In yet another embodiment, the leadframe may be cut off with a dicing blade in the step j). In such an embodiment, even if the leadframe includes multiple die pads, the leadframe can be easily divided for respective resin-molded semiconductor devices (or packages).

A second inventive method for manufacturing a resin-molded semiconductor device includes the step of a) forming frame rails, multiple sets of inner lead portions and die pads out of a single metal plate. Each said set of inner lead portions are supported by a first group of joining/supporting members that extend inward from the associated frame rail and are joined together by a second group of joining/supporting members. The method further includes the step of b) forming convex portions on a surface of the inner lead portions so that the convex portions are spaced apart from each other. The surface is opposite to an upper surface of the die pads on which semiconductor chips will be bonded. The method further includes the step of c) placing a lead retaining member on respective surfaces of the inner lead portions and the frame rails and thereby getting the inner lead portions and the frame rails retained by the retaining member. The surfaces on which the retaining member is placed may be either the same as, or opposite to, the upper surface of the die pads on which the chips will be bonded. The method further includes the step of d) removing, from at least some of the joining/supporting members of the second group for the inner lead portions, respective parts thereof located between adjacent ones of the convex portions or between one of the convex portions and the associated die pad that are adjacent to each other, thereby forming inner leads that have been selectively isolated from the die pads and obtaining a leadframe with the lead retaining member. The method further includes the steps of e) bonding the chips onto the upper surface of the die pads of the leadframe; and f) electrically connecting the chips to the isolated inner leads using metal fine wires. If the lead retaining member has been placed on the surface of the leadframe on which the chips have been bonded, the method further includes the step of g) removing the lead retaining member from the surface of the leadframe on which the chips have been bonded. The method further includes the step of h) molding the chips, the die pads and the inner leads together with a resin encapsulant so that the convex portions of the inner leads have their top exposed. If the lead retaining member has been placed on another surface of the leadframe opposite to the surface thereof on which the chips have been bonded, the method further includes the step of i) removing the lead retaining member from the opposite surface of the leadframe. And the method further includes the step of j) dividing the leadframe, along with the members assembled thereon, into multiple packages so that each said package includes at least one of the chips.

According to the second inventive manufacturing method, the second inventive resin-molded semiconductor device can be formed just as intended by using the second inventive leadframe.

In one embodiment of the second manufacturing method, the convex portions may be formed in the step b) by etching away a part of each said joining/supporting member of the second group. The part to be etched may be located either between the parts of the associated inner lead portions where the convex portions will be formed or between the part of the associated inner lead portion where the convex portion will be formed and the associated die pad. Also, the part may be etched away from a surface of the joining/supporting members of the second group opposite to the surface of the leadframe on which the chips will be bonded.

In an alternative embodiment, the convex portions may also be formed in the step b) by pressing a part of each said joining/supporting member of the second group. The part to be pressed may be located either between the parts of the associated inner lead portions where the convex portions will be formed or between the part of the associated inner lead portion where the convex portion will be formed and the die pad. Also, the part may be pressed on a surface of the joining/supporting members of the second group opposite to the surface of the leadframe on which the chips will be bonded.

In yet another embodiment, a part of each selected joining/supporting member of the second group, which part is located either between associated ones of the convex portions or between associated one of the convex portions and the die pad, may be cut off in the step d) with cutting means, thereby isolating the convex portions from each other or from the die pad.

In this particular embodiment, the cutting means preferably has a cut face, which is substantially parallel to respective upper surfaces of the convex portions and the die pads.

In yet another embodiment, the lead retaining member may be chemically dissolved and removed in the step g) or i).

In yet another embodiment, the leadframe may be cut off in the step j) with a dicing blade.

A third inventive method for manufacturing a resin-molded semiconductor device includes the step of a) forming frame rails, multiple sets of lands, multiple sets of inner leads and die pads out of a single metal plate. Each said set of lands are supported by joining/supporting members extending inward from the associated frame rail and are joined together so as to be spaced apart from each other. Each said set of inner leads electrically connect some of the lands together. And each said die pad has an upper surface on which a semiconductor chip will be bonded. The method further includes the step of b) placing a lead retaining member on respective surfaces of the lands and the frame rails and thereby getting the lands and the frame rails retained by the retaining member. The surfaces on which the retaining member is placed may be either the same as, or opposite to, the upper surface of the die pads on which the chips will be bonded. The method further includes the step of c) removing, from at least some of the joining/supporting members, respective parts thereof located between adjacent ones of the lands, thereby selectively isolating the lands and obtaining a leadframe with the lead retaining member. The method further includes the steps of d) bonding the chips onto the upper surface of the die pads of the leadframe; and e) electrically connecting the chips to the isolated inner leads using metal fine wires. If the lead retaining member has been placed on the surface of the leadframe on which the chips have been bonded, the method further includes the step of f) removing the lead retaining member from the surface of the leadframe on which the chips have been bonded. The method further includes the step of g) molding the chips, the die pads and the inner leads together with a resin encapsulant so that the convex portions of the inner leads have their top exposed. If the lead retaining member has been placed on another surface of the leadframe opposite to the surface thereof on which the chips have been bonded, the method further includes the step of h) removing the lead retaining member from the opposite surface of the leadframe. And the method further includes the step of i) dividing the leadframe, along with the members assembled thereon, into multiple packages so that each said package includes at least one of the chips.

In the third manufacturing method, the lands and frame rails are retained by the lead retaining member on their upper and/or lower surface(s). Accordingly, even if a leadframe, including not only the lands but also the inner leads for electrically connecting some of the lands together, should be used, neither the lands nor the inner leads will drop off from the frame rail. Thus, a small-sized leadframe, including lands arranged in multiple rows, can be easily made out of a single-layer metal plate.

In one embodiment of the third manufacturing method, the step a) may include the step of forming the inner leads out of the joining/supporting members between the lands by etching away respective parts of the metal plate from a surface thereof, on which the chips will be bonded, to approximately half the thickness of the metal plate while masking other parts of the metal plate that will be respective center portions of the lands extending in parallel to the associated joining/supporting member and also masking still other parts of the metal plate that will be the inner leads located between the associated lands. And the step a) may further includes the step of etching away yet other parts of the metal plate from another surface thereof, opposite to the surface thereof on which the chips will be bonded, with the parts of the metal plate to be the lands masked on the opposite surface so that the lands and the inner leads are isolated from each other.

Then, each of the lands will have a cross-sectional shape with an upwardly decreasing width and each of the inner leads, formed between adjacent lands, will have its top positioned approximately as high as that of the lands and its bottom positioned higher than that of the lands. Thus, the third inventive resin-molded semiconductor device can be formed just as intended.

DESCRIPTION OF THE PREFERRED EMBODIMENTS

Embodiment 1

Hereinafter, a first embodiment of the present invention will be described with reference to the accompanying drawings.

Figure 1:
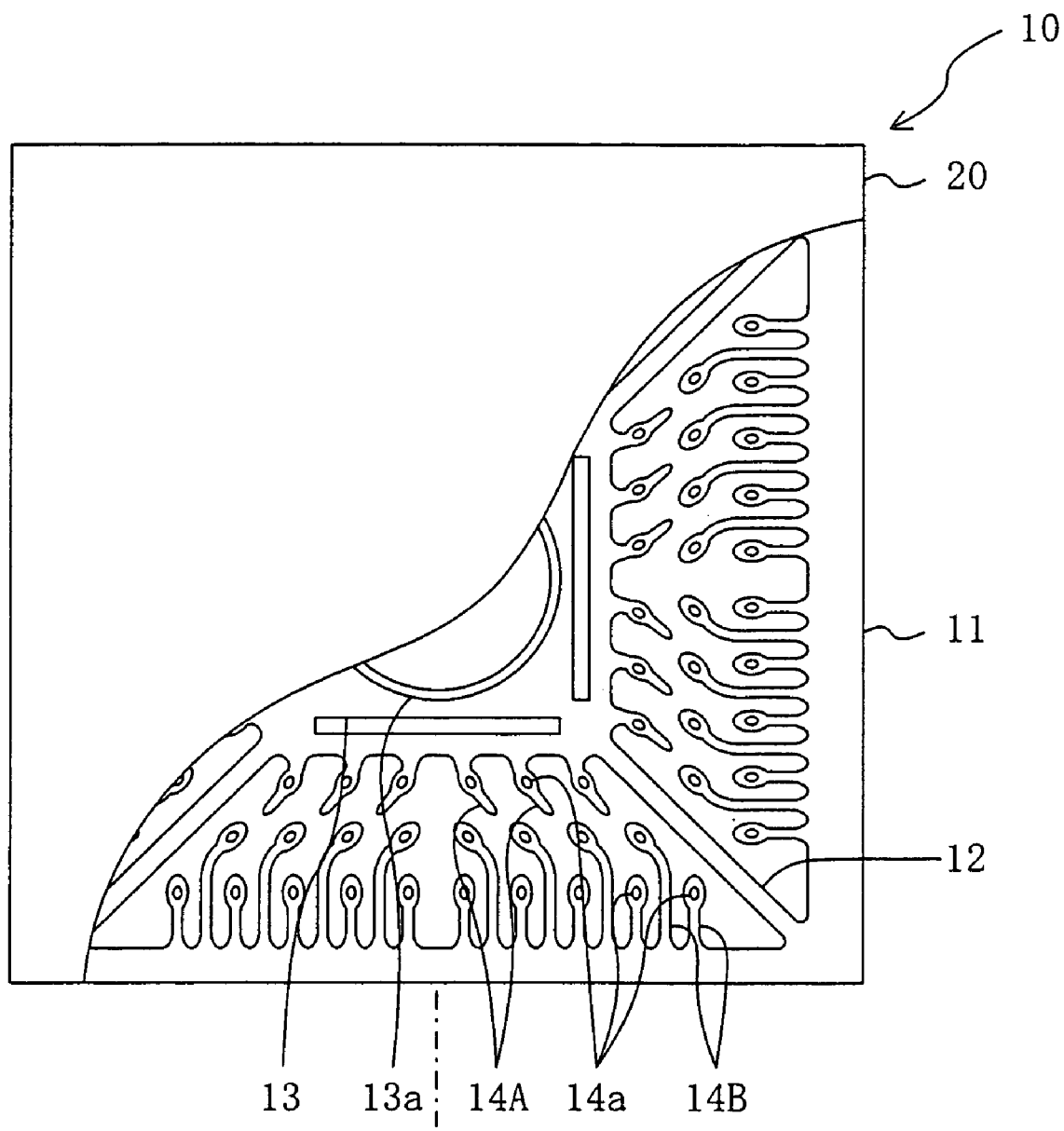
FIG. 1 is a bottom view illustrating a leadframe portion, including one of the die pads of a leadframe according to a first embodiment of the present invention, before internal inner lead portions of the leadframe are isolated.

FIG. 1 is a bottom view illustrating a leadframe portion 10 including one of the die pads of a leadframe according to a first embodiment of the present invention before internal inner lead portions of the leadframe are isolated.

As shown in FIG. 1, the leadframe portion 10 includes frame rail 11, support leads 12, die pad 13, internal inner lead portions 14A and external inner lead portions 14B. The support leads 12 are equivalent to the joining/supporting members as defined in the appended claims. The die pad 13 is supported inside the frame rail 11 by the support leads 12 at the four corners and is used to mount a semiconductor chip on the upper surface thereof (i.e., its surface opposite to that illustrated in FIG. 1). The internal inner lead portions 14A are supported to surround the die pad 13 and each include a convex portion 14a on the bottom thereof. The external inner lead portions 14B are disposed between the internal inner lead portions 14A and the frame rail 11, extend inward from the frame rail 11 and each also include the convex portion 14a on the bottom thereof. In the example illustrated in FIG. 1, the bottom of the die pad 13 has a concave portion 13a at the center thereof.

The leadframe portion 10 of the first embodiment is characterized by getting the frame rail 11 and internal and external inner lead portions 14A and 14B retained by an adhesive tape 20 on the bottom thereof. The adhesive tape 20 is an exemplary lead retaining member as defined in the claims.

Figure 2:
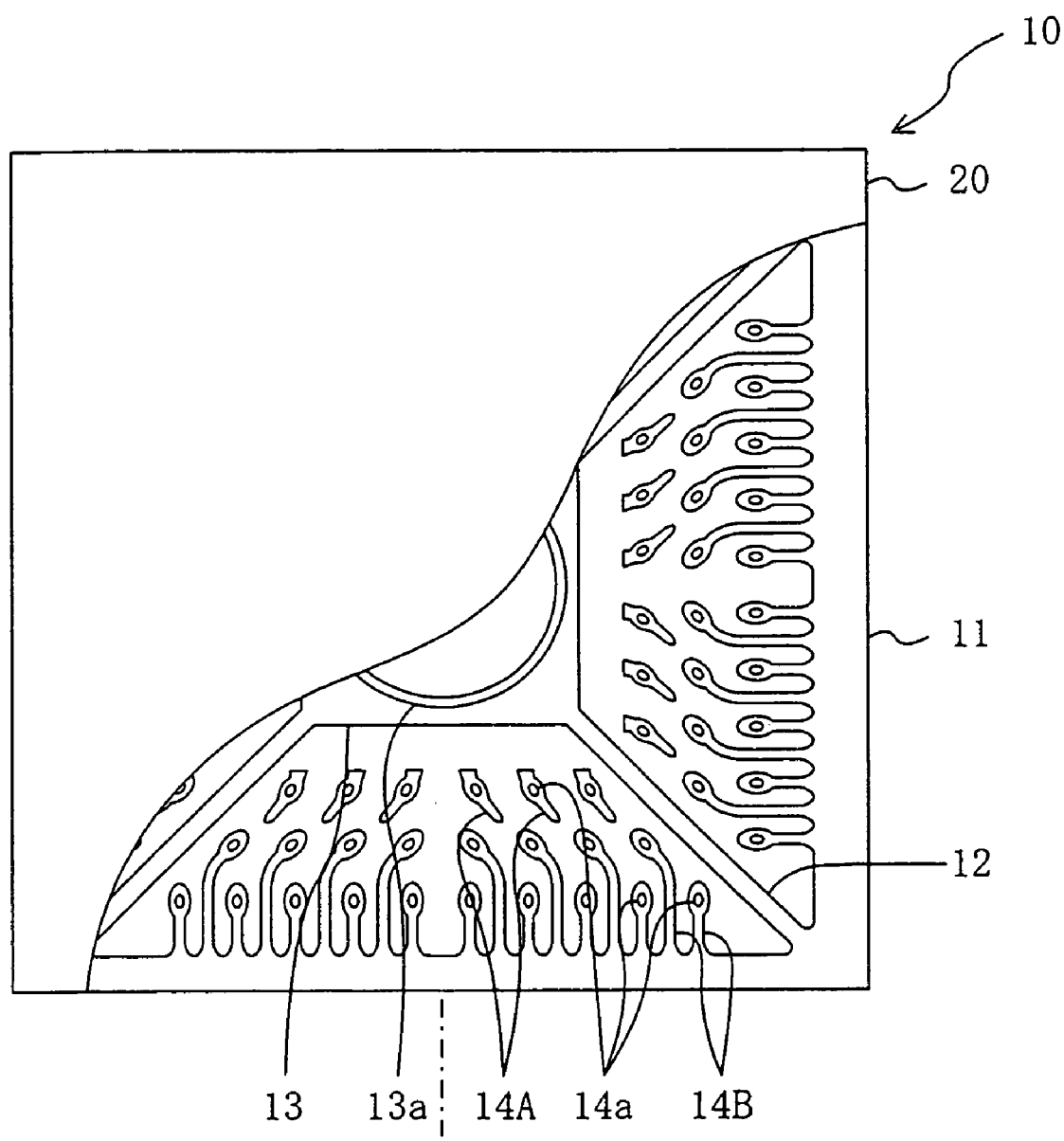
FIG. 2 is a bottom view illustrating the leadframe portion, including one of the die pads of the leadframe of the first embodiment, after the internal inner lead portions have been isolated.

FIG. 2 illustrates the bottom of the leadframe portion 10 shown in FIG. 1 after the internal inner lead portions 14A have been isolated. As shown in FIG. 2, the portions that used to connect the internal inner lead portions 14A to the die pad 13 have been cut off and etched away. Thus, internal inner leads 14A, isolated from the die pad 13, have been formed.

The internal and external inner lead portions 14A and 14B and the semiconductor chip (not shown) will be molded together with a resin encapsulant so that only the respective tops of the convex portions 14a thereof will be exposed on the bottom. Then, the exposed parts of the convex portions 14a will be used as lands, i.e., external terminals.

In the first embodiment, the frame rail 11 and internal inner lead portions 14A are retained by the adhesive tape 20 on the bottom. Accordingly, even if the internal inner lead portions 14A are isolated from the die pad 13 after that by a cutting or etching process, the internal inner leads 14A will not drop off from the frame rail 11. Accordingly, there is no need to provide any joining/supporting member for getting the internal inner leads 14A supported by the frame rail 11. For that reason, even if the lands are arranged in three-or more rows between the frame rail 11 and die pad 13, the frame rail 11 still can be formed in a desired small size. As described above, a known LGA type semiconductor device, including lands arranged in three or more rows between its side faces and the die pad, normally needs a stack of ceramic or plastic film members. In contrast, according to the present invention, a device of that type is easily implementable using a leadframe made of a single metal plate.

In the illustrated embodiment, the adhesive tape 20 is attached to the entire bottom of the leadframe portion 10. However, the tape 20 may be attached to either the upper or back surface of the leadframe portion 10 so long as the isolated internal inner leads 14A can be retained with respect to the die pad 13 or frame rail 11. It should be noted that where the tape 20 is attached to the upper surface of the leadframe portion 10, the tape 20 should not interfere with the die and wire bonding process steps to be performed on the semiconductor chip.

Also, in the foregoing embodiment, the adhesive tape 20 is used as an exemplary lead retaining member for retaining the isolated internal inner leads 14A thereon. Alternatively, the lead retaining member may be a metal thin film of aluminum, for example. That is to say, the retaining member may be either electrically insulating or conductive.

Hereinafter, it will be outlined with reference to FIGS. 3A through 3D how to make the leadframe of the first embodiment.

FIGS. 3A through 3D illustrate cross-sectional structures corresponding to respective process steps for making the leadframe of the first embodiment.

Figure 3A:
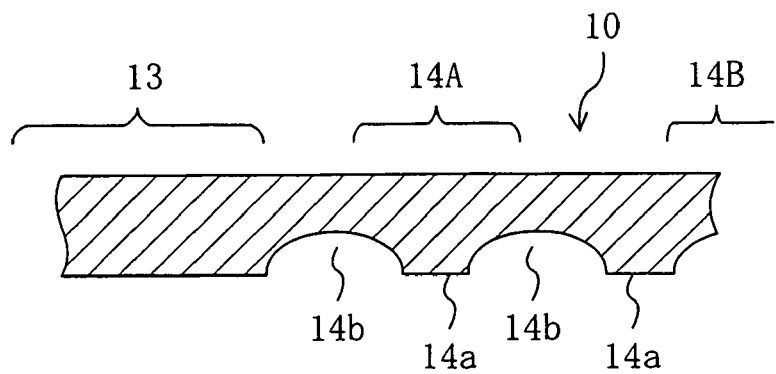
FIGS. 3A through 3D are partial cross-sectional views illustrating respective process steps for making the leadframe of the first embodiment.

First, as shown in FIG. 3A, a prototype of the leadframe 10 is prepared by shaping (e.g., stamping or etching) a metal plate of an alloy mainly composed of copper (Cu) or an alloy of iron (Fe) and nickel (Ni). The leadframe 10 includes the frame rail (not shown in FIG. 3A), die pads 13 and internal and external inner lead portions 14A and 14B. Each of the die pads 13 is included in its associated portion of the frame rail. The internal inner lead portions 14A are connected to, and surround, the associated die pad 13. And the external inner lead portions 14B are connected to the associated portion of the frame rail.

Subsequently, concave portions 14b are formed in the bottom of the leadframe prototype 10 where the internal and external inner lead portions 14A and 14B will be formed, thereby forming convex portions 14a that will be used as lands. More specifically, parts of the leadframe prototype 10 that should be located between each die pad 13 and associated internal inner lead portions 14A and between associated internal and external inner lead portions 14A and 14B are pressed or half-etched on/from the bottom thereof using a die assembly. In this manner, the convex portions 14a for the internal and external inner lead portions 14A and 14B are formed.

Figure 3B:
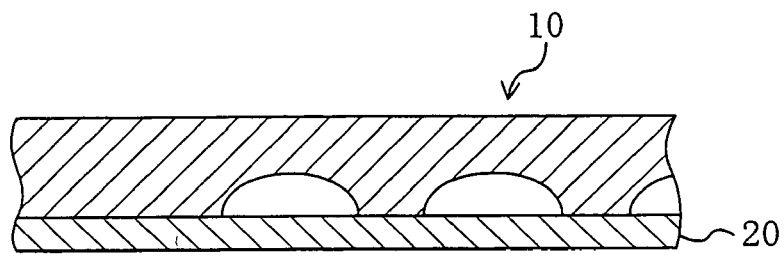

Next, as shown in FIG. 3B, an adhesive tape 20 is attached onto the bottom of the leadframe prototype 10, for example.

Figure 3C:
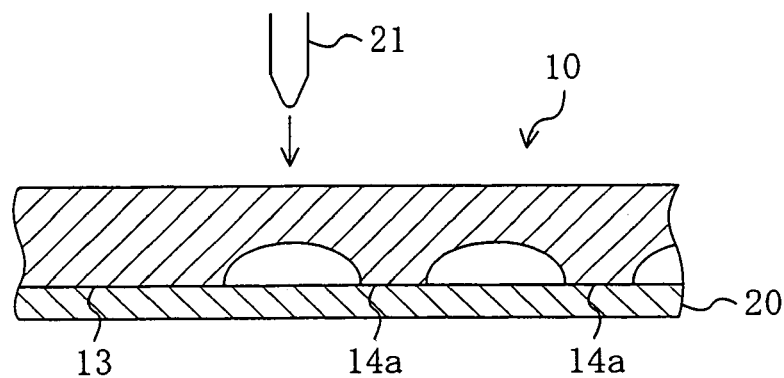
Figure 3D:
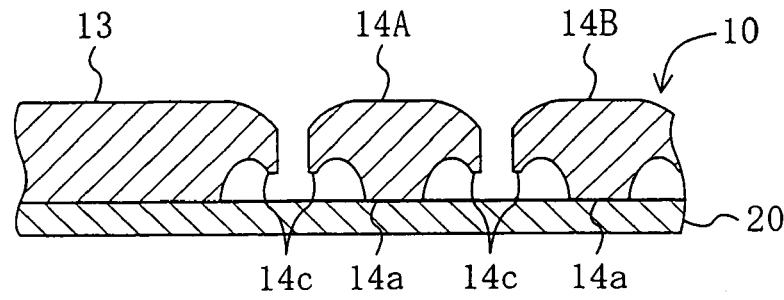

Then, as shown in FIG. 3C, parts of the leadframe prototype 10 located over the respective concave portions 14b, i.e., parts that should be located between each die pad 13 and associated internal inner leads 14A and between associated internal and external inner leads 14A and 14B, are punched out and removed using a punch 21 as cutting means. In this manner, the internal inner leads 14A, isolated from the die pad 13, and the external inner leads 14B are formed as shown in FIG. 3D. In this process step, not all of the convex portions 14a but only desired ones of them should be isolated.

Where the punch 21 is used to isolate the convex portions 14a as is done in the first embodiment, a burred portion 14c is unintentionally formed around each of the isolated convex portions 14a as shown in FIG. 3D. In this case, the top of the burred portions 14c should not exceed the top of the convex portions 14a. This is because so long as the top of the convex portions 14a is higher than that of the burred portions 14c, only the uppermost parts of the convex portions 14a will be exposed after the respective members have been molded together with a resin encapsulant. Accordingly, no leakage current should flow when the package is mounted onto a motherboard.

The convex portions 14a may also be isolated by etching away those portions instead of stamping them.

Modified Leadframe Making Method According to Embodiment 1

Hereinafter, a modified method of making the leadframe of the first embodiment will be described with reference to FIGS. 4A through 4D.

FIGS. 4A through 4D illustrate cross-sectional structures corresponding to respective process steps for making a leadframe according to a modified example of the first embodiment. In FIGS. 4A through 4D, each member also shown in FIGS. 3A through 3D is identified by the same reference numeral and the description thereof will be omitted herein.

Figure 4A:
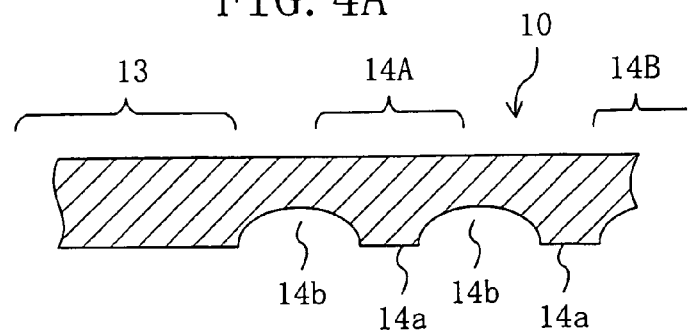
FIGS. 4A through 4D are partial cross-sectional views illustrating respective process steps for making a leadframe according to a modified example of the first embodiment.
Figure 4B:
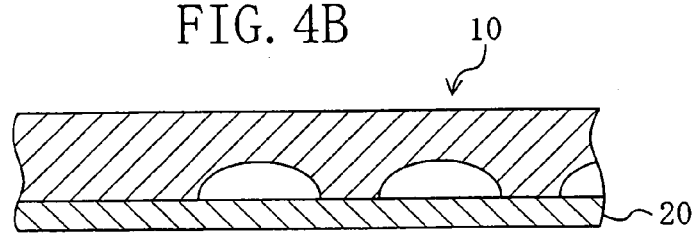
Figure 4C:
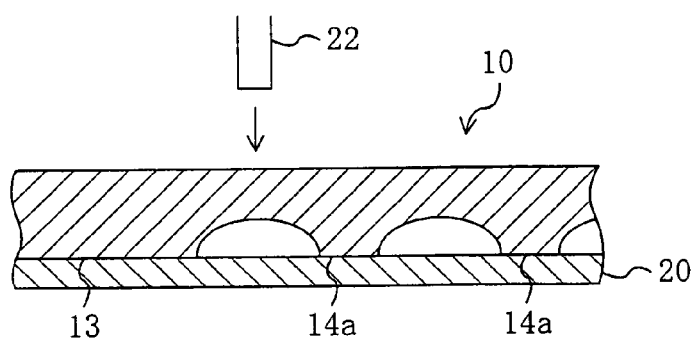

This modified example is characterized by using an alternative punch 22 having a cut face substantially parallel to the upper surface of the workpiece (i.e., the leadframe prototype 10 in this case) as shown in FIG. 4C.

Figure 4D:
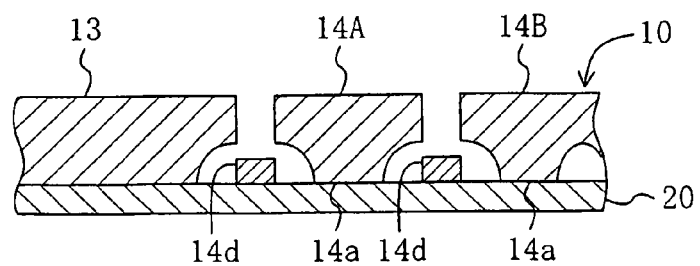

By using the punch 22 of this type, the die pad 13 and internal and external inner leads. 14A and 14B can be formed without producing any burred portion on each side face of these members as shown in FIG. 4D.

As also shown in FIG. 4D, cut debris 14d separates from the leadframe prototype 10 instead. But the debris 14d drops onto the adhesive tape 20. Accordingly, if the adhesive tape 20 is heated to such a temperature as to increase the adhesion thereof sufficiently before the tape 20 is peeled off, then the debris 14d can get strongly adhered to the tape 20. In this manner, it is possible to prevent the debris 14d from scattering and having unfavorable effects on the manufacturing process.

The burred portions 14c can be eliminated not just by the punch 22 having a cut face substantially parallel to the surface of the workpiece but also a punch having a concave cut face that will press and partially punch out the surface of the workpiece.

Embodiment 2

Hereinafter, a second embodiment of the present invention will be described with reference to the accompanying drawings.

Figure 5A:
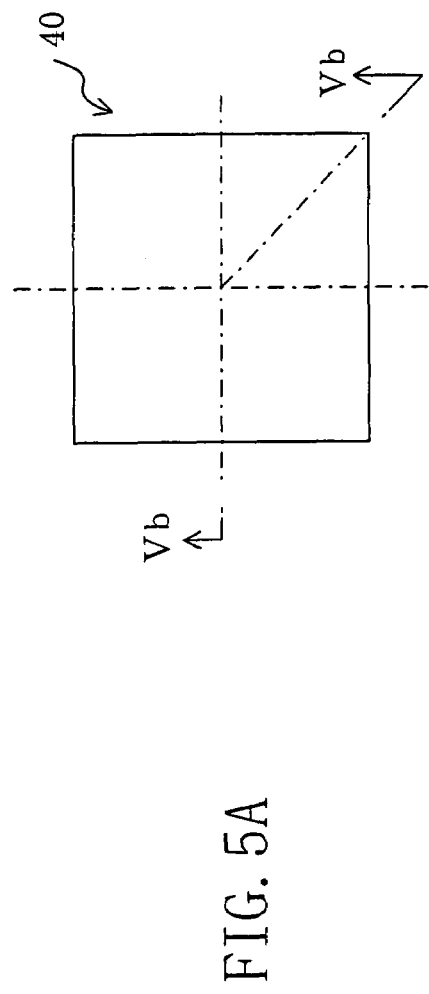
FIGS. 5A and 5B are respectively a plan view and a cross-sectional view, taken along the line Vb—Vb shown in FIG. 5A, illustrating a resin-molded semiconductor device according to a second embodiment of the present invention.
Figure 5B:
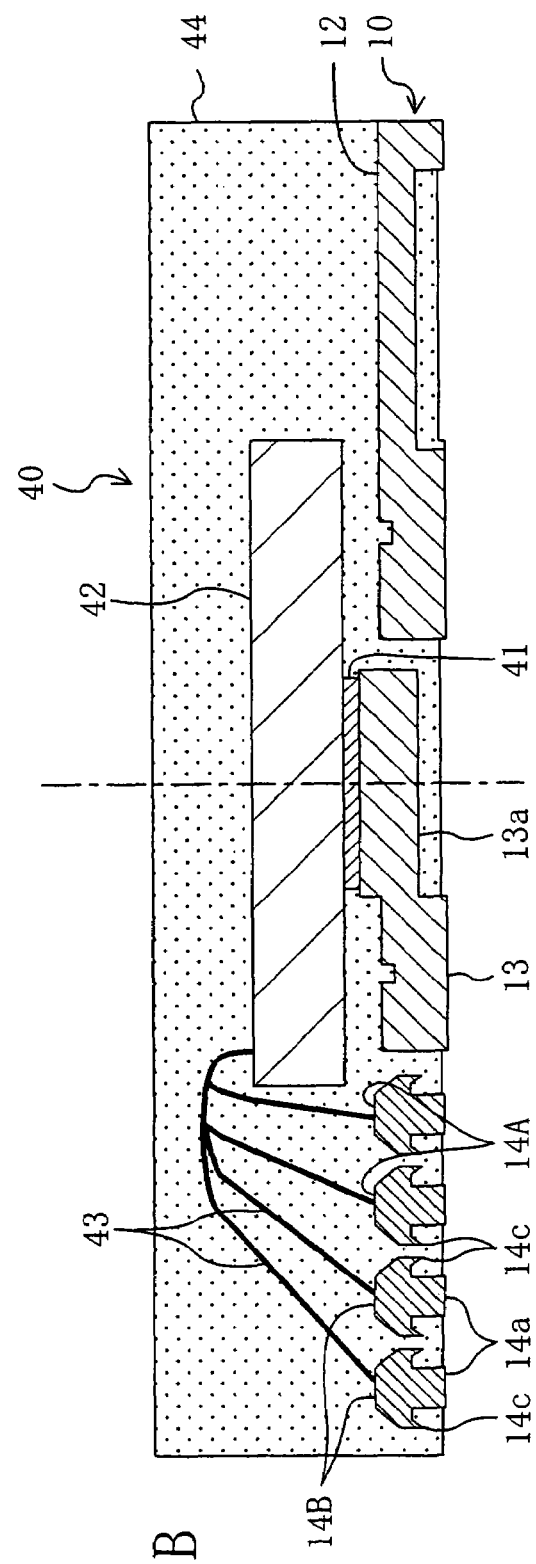

FIGS. 5A and 5B respectively illustrate a planar layout and an enlarged cross-sectional structure, taken along the line Vb—Vb shown in FIG. 5A, of a resin-molded semiconductor device according to the second embodiment. In FIGS. 5A and 5B, each member also shown in FIGS. 2 through 3D is identified by the same reference numeral and the description thereof will be omitted herein.

The resin-molded semiconductor device 40 of the second embodiment shown in FIGS. 5A and 5B uses a leadframe similar to the leadframe 10 of the first embodiment shown in FIG. 2. As shown in FIG. 5B, the leadframe 10 of the device 40 includes internal and external inner leads 14A and 14B that are arranged in four rows in total (i.e., two rows apiece).

As also shown in FIG. 5B, the device 40 further includes semiconductor chip 42, metal fine wires 43 and resin encapsulant 44. The chip 42 has been bonded and secured to the die pad 13 of the leadframe 10 using a silver paste 41. The wires 43 may be made of gold (Au) and electrically connect external terminals (not shown) of the chip 42 to the internal and external inner leads 14A and 14B.

The resin encapsulant 44 may be a thermosetting resin, for example, and has been filled to mold the chip 42, die pad 13 and internal and external inner leads 14A and 14B together with the respective tops of the convex portions 14a of the leads 14A and 14B and the bottom of the die pad 13 exposed.

As already described for the first embodiment, when the convex portions 14a are isolated by removing the intervening portions with the punch, the burred portion 14c is formed around each of those convex portions 14a. However, the top of the burred portions 14c is lower than that of the convex portions 14a as shown in FIG. 5B.

Hereinafter, it will be described how to manufacture the resin-molded semiconductor device 40 with such a structure.

First, as described for the first embodiment, a leadframe 10 with an adhesive tape 20 is prepared to prevent the isolated leads from dropping off. At this stage, the leadframe 10 includes multiple die pads 13 and multiple sets of internal and external inner leads 14A and 14B for a plurality of semiconductor chips 42. In this process step, the tape 20 may be attached to the lower and/or upper surface(s) of the leadframe 10.

Next, a die bonding process step is performed. Specifically, the semiconductor chips 42 are bonded onto the upper surface of the die pads 13 of the leadframe 10 using silver paste 41.

Then, a wire bonding process step is performed. That is to say, the external terminals of each of the semiconductor chips 42 are electrically connected to the associated set of internal and external inner leads 14A and 14B using wires 43.

Thereafter, a resin molding process step is carried out. Where the adhesive tape 20 has been attached onto part of the upper surface of the leadframe 10 on which the chips 42 have been mounted, the tape 20 is removed from the upper surface by peeling it off or chemically dissolving it. Then, the chips 42, die pads 13 and internal and external inner leads 14A and 14B are molded together with a resin encapsulant 44 so that the top of the convex portions 14a and the bottom of the die pads 13 are exposed on the back surface of the resin encapsulant 44.

To dissolve the tape 20 made of polyimide, for example, an aqueous solution of sodium hydroxide with a concentration of about 50%, which has been heated to about 105–110° C., or a mixture of hydrazine and ethylenediamine may be used as a solvent.

Subsequently, a dicing process step is carried out. Specifically, where the adhesive tape 20 has been attached to bottom of the leadframe 10 opposite to the upper surface thereof on which the chips 42 have been bonded, the tape 20 is removed from the bottom by peeling it off or chemically dissolving it. Then, the assembly, including the semiconductor chips 42 and leadframe 10 that have been molded together with the resin encapsulant 44, is diced into respective packages using a dicing blade, for example, so that each package includes at least one of the chips 42.

By performing these process steps, the resin-molded semiconductor device shown in FIGS. 5A and 5B is completed.

As shown in FIG. 5B, the leadframe 10 of the present invention includes a concave portion 13a on the bottom thereof. Accordingly, part of the resin encapsulant 44 located under the semiconductor chip 42 has an increased thickness, thus decreasing the difference between the two types of stresses applied downward and upward to the chip 42 through the resin encapsulant 44. As a result, a decreased stress is actually placed on the chip 42. In addition, the device can also have its waterproofness increased because it takes a long distance for water to enter the chip 42 from the bottom of the resin encapsulant 44 under the die pad 13. Consequently, the semiconductor device can show improved long-term reliability. optionally, the internal and external inner leads 14A and 14B may have their upper surface plated with silver (Ag) and the leads 14A and 14B and die pad 13 may have their bottom plated with alloyed solder containing tin (Sn) and lead (Pb) or tin (Sn) and bismuth (Bi). Then, it is easier to electrically connect the chip 42 to the leadframe 10 in the wire bonding process step or the package to the motherboard in the mounting process step.

Also, where the leadframe 10 is made of a copper alloy, the upper and lower surfaces of the inner leads 14A and 14B and the back surface of the die pad 13 may be plated with a single type of alloy containing nickel (Ni), palladium (Pd) and gold (Au).

Embodiment 3

Hereinafter, a third embodiment of the present invention will be described with reference to the accompanying drawings.

Figure 6A:
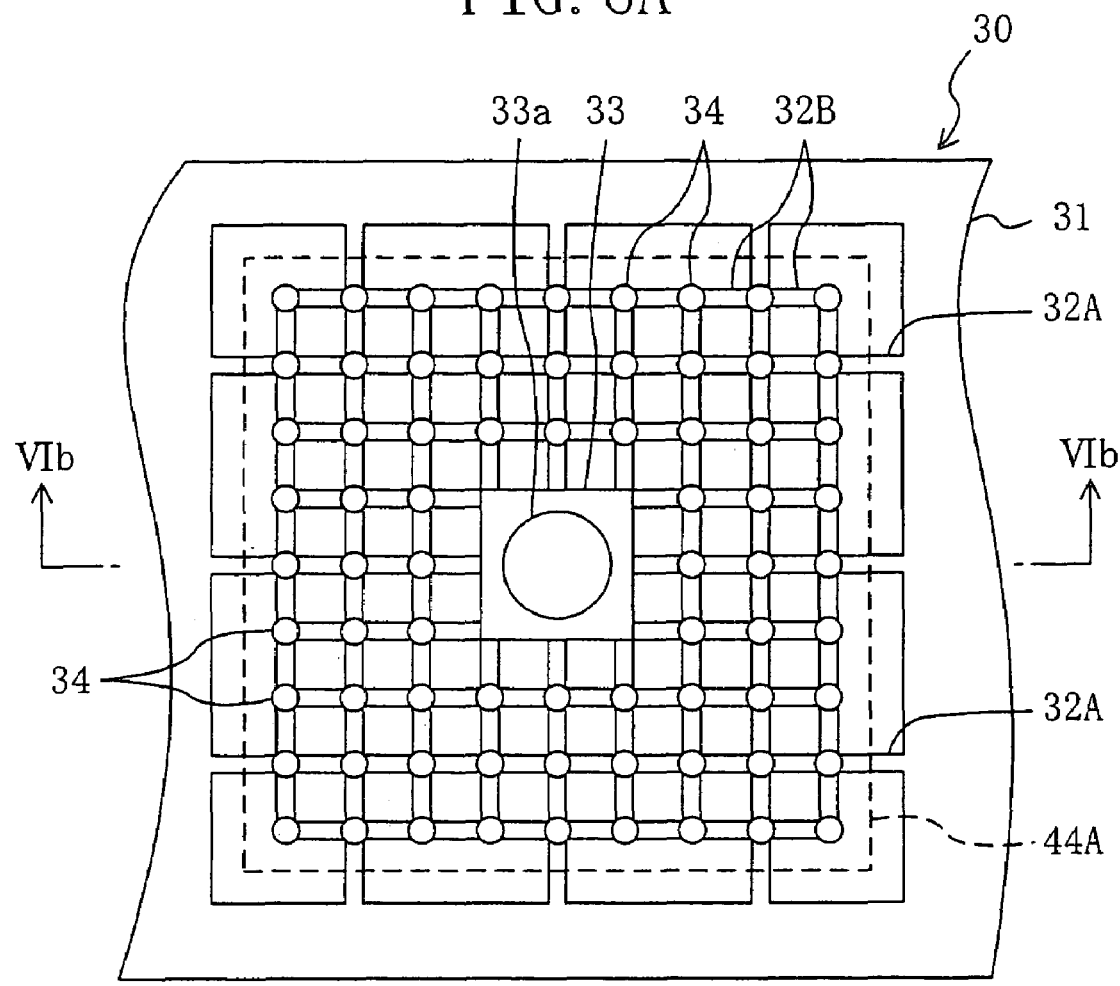
FIG. 6A is a bottom view illustrating a leadframe portion, including one of the die pads of a leadframe according to a third embodiment of the present invention, before lands of the leadframe are isolated.
Figure 6B:
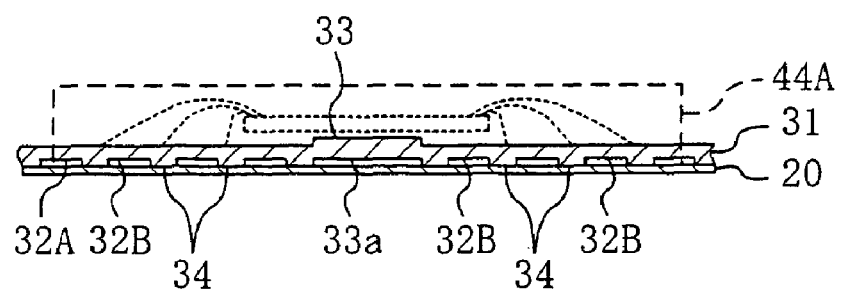
FIG. 6B is a cross-sectional view thereof taken along the line VIb—VIb shown in FIG. 6A.

FIG. 6A is a bottom view illustrating a leadframe portion 30 including one of the die pads of a leadframe according to the third embodiment before lands of the leadframe are isolated. FIG. 6B illustrates a cross-sectional structure thereof taken along the line VIb—VIb shown in FIG. 6A.

As shown in FIGS. 6A and 6B, the leadframe portion 30 includes frame rail 31, die pad 33 and inner lead portions 34. The die pad 33 is disposed inside the frame rail 31 to mount a semiconductor chip on the upper surface thereof. The inner lead portions 34 are arranged in three rows along each of the four sides of the die pad 33 as shown in FIG. 6A. As shown in FIG. 6B, each of the inner lead portions 34 includes a convex portion to be a land on the bottom of the leadframe portion 30, i.e., opposite to the upper surface of the leadframe portion 30 on which the chip will be mounted.

Some of the inner lead portions 34 are supported by rail joining/supporting members 32A extending inward from the frame rail 31. The rail joining/supporting members 32A are equivalent to the first group of joining/supporting members as defined in the appended claims. The other inner lead portions 34A are either connected together or connected to the die pad 33 by land joining/supporting members 32B, which are equivalent to the second group of joining/supporting members as defined in the claims.

Each of these convex portions is formed by pressing or half-etching part of the associated land joining/supporting member 32B, which part should be located between the convex portion and an adjacent convex portion or between the convex portion and the die pad 33.

A concave portion 33a has been formed at the center of the bottom of the die pad 33. In FIGS. 6A and 6B, the dashed line 44A indicates a region in which the respective members will be molded together with a resin encapsulant.

As shown in FIG. 6B, the leadframe portion 30 of the third embodiment is characterized in that the frame rail 31 and inner lead portions 34 are retained by an adhesive tape 20 (i.e., an exemplary lead retaining member) on the bottom thereof. It should be noted that the adhesive tape 20 is not illustrated in FIG. 6A.

Figure 7A:
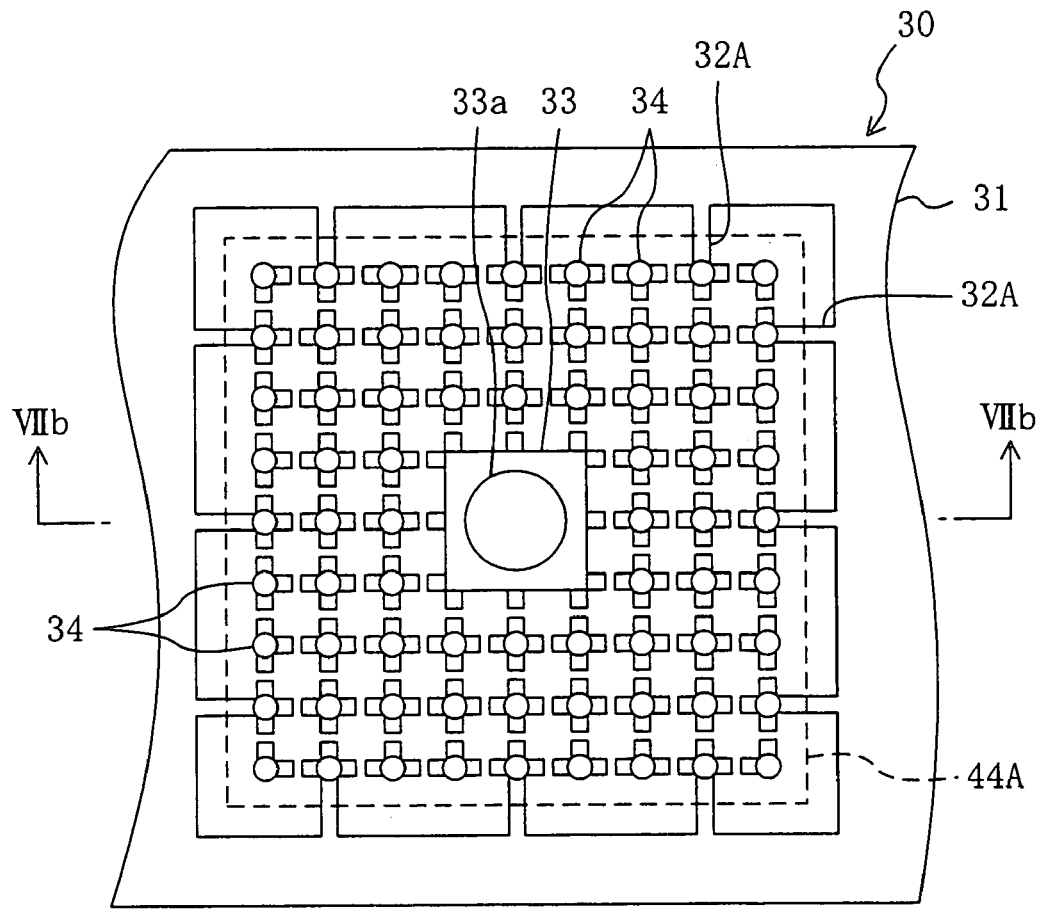
FIG. 7A is a bottom view illustrating the leadframe portion, including one of the die pads of the leadframe of the third embodiment, after the lands have been isolated.
Figure 7B:
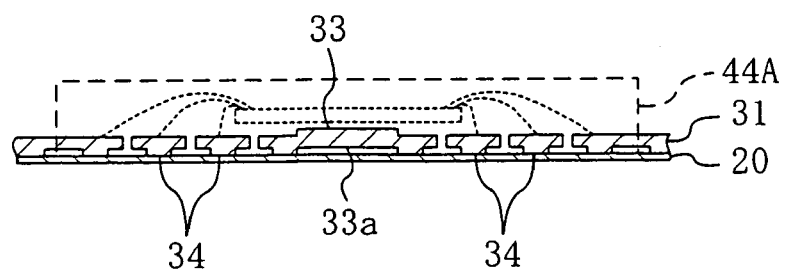
FIG. 7B is a cross-sectional view thereof taken along the line VIIb—VIIb shown in FIG. 7A.

FIG. 7A is a bottom view illustrating the leadframe portion 30 shown in FIGS. 6A and 6B after the lands 34 have been isolated. FIG. 7B illustrates a cross-sectional structure thereof taken along the line VIIb—VIIb shown in FIG. 7A. As shown in FIGS. 7A and 7B, each land joining/supporting member 32B has been partially cut out or etched away, and each inner lead 34 is now isolated from adjacent inner leads 34 or from the die pad 33.

In the third embodiment, the frame rail 31 and inner lead portions 34 are retained by the adhesive tape 20 on the bottom. Accordingly, even after the inner lead portions 34 have been electrically isolated from each other or from the die pad 33, neither the inner leads 34 nor the die pad 33 will drop off from the frame rail 31. Accordingly, there is no need to provide the joining/supporting members to be connected to the frame rail 31 for all of the inner leads 34 and die pad 33. For that reason, even if the lands are arranged in three or more rows between the frame rail 31 and die pad 33, the frame rail 31 still can be formed in a desired small size. As described above, a known LGA type semiconductor device, including lands arranged in three or more rows between its side faces and the die pad, normally needs a stack of ceramic or plastic film members. In contrast, according to the present invention, a device of that type is easily implementable using a leadframe made of a single metal plate.

In the illustrated embodiment, the adhesive tape 20 is attached to the bottom of the leadframe portion 30. However, the tape 20 may be attached to either the upper or lower surface of the leadframe portion 30 so long as the isolated inner leads 34 and die pad 33 can be retained with respect to the frame rail 31. It should be noted that where the tape 20 is attached to the upper surface of the leadframe portion 30, the tape 20 should not interfere with the die and wire bonding process steps to be performed on the semiconductor chip.

Also, in the foregoing embodiment, the adhesive tape 20 is used as an exemplary lead retaining member for retaining the isolated inner leads 34. Alternatively, the lead retaining member may also be a metal thin film of aluminum, for example. That is to say, the retaining member may be either electrically insulating or conductive.

In the third embodiment, the lands may be isolated by a punching process using a punch or by an etching process. For example, where a punching process is performed, a burred portion will be unintentionally formed around each of the isolated inner leads 34 as in the first embodiment. In that case, the top of the burred portions should not be higher than that of the convex portions.

Also, not all of the inner lead portions 34 have to be isolated. Suppose the semiconductor chip to be mounted on the die pad 33 is greater in size than the die pad 33 and hangs over the die pad 33. In that case, the inner lead portions 34 overlapped by the periphery of the big semiconductor chip are preferably kept connected to the die pad 33. Then, the die pad 33 can have its heat dissipation area and heat capacity increased, thus improving the heat dissipation of the resultant resin-molded semiconductor device.

Modified Example of Embodiment 3

Hereinafter, a modified example of the third embodiment will be described with reference to the accompanying drawings.

Figure 8A:
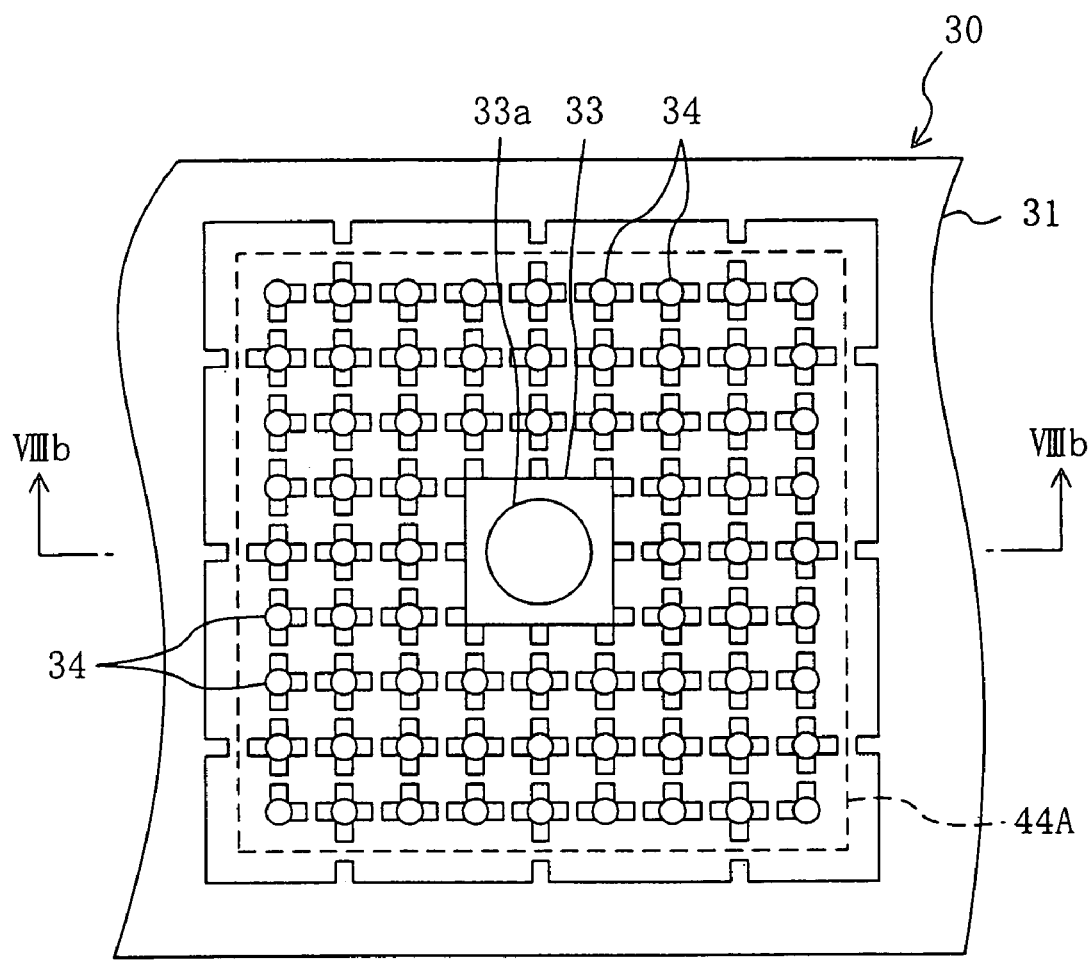
FIG. 8A is a bottom view illustrating a leadframe portion, including one of the die pads of a leadframe according to a modified example of the third embodiment, after lands of the leadframe have been isolated.
Figure 8B:
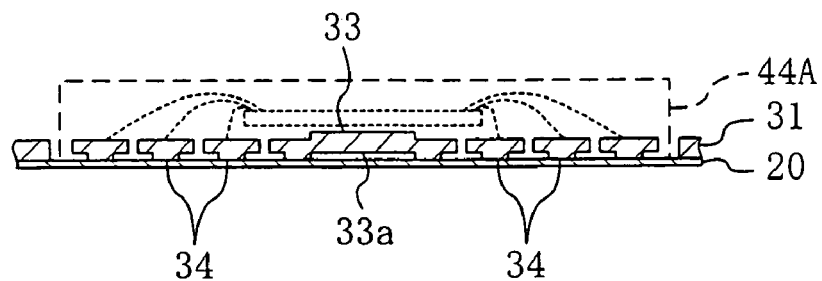
FIG. 8B is a cross-sectional view thereof taken along the line VIIIb—VIIIb shown in FIG. 8A.

FIG. 8A is a bottom view illustrating a leadframe portion 30 including one of the die pads of a leadframe according to a modified example of the third embodiment after the lands of the leadframe have been isolated. FIG. 8B illustrates a cross-sectional structure thereof taken along the line VIIIb—VIIIb shown in FIG. 8A. In FIGS. 8A and 8B, each member also shown in FIGS. 7A and 7B is identified by the same reference numeral and the description thereof will be omitted herein.

In the modified example illustrated in FIGS. 8A and 8B, not only the land joining/supporting members 32B but also the rail joining/supporting members 32A that connected the inner lead portions 34 to the frame rail 31 have been partially cut out or etched away.

If the rail joining/supporting members 32A are partially removed this way, no parts of the leadframe portion 30 are exposed on the side faces of the resin encapsulant 44 as shown in FIG. 8B. Accordingly, when the resin-molded semiconductor device is mounted onto a motherboard, substantially no leakage current will flow through the side faces of the resin encapsulant 44.

Embodiment 4

Hereinafter, a fourth embodiment of the present invention will be described with reference to the accompanying drawings.

FIGS. 9A, 9B, 9C and 9D respectively illustrate plan, front, right side and bottom views of a resin-molded semiconductor device according to the fourth embodiment. In FIGS. 9A through 9D, each member also shown in FIGS. 7A and 7B is identified by the same reference numeral and the description thereof will be omitted herein.

Figure 9A:
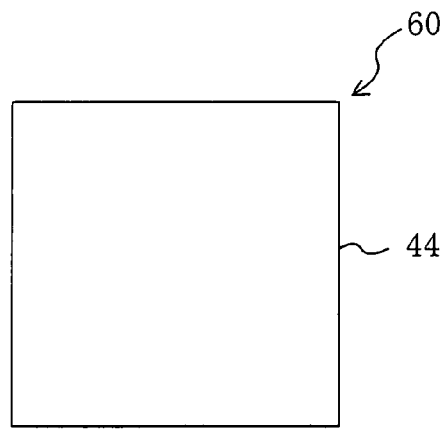
FIGS. 9A, 9B, 9C and 9D are respectively plan, front, right side and bottom views illustrating a resin-molded semiconductor device according to a fourth embodiment of the present invention.
Figure 9C:
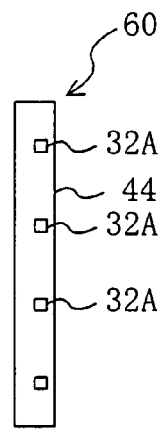
Figure 9B:
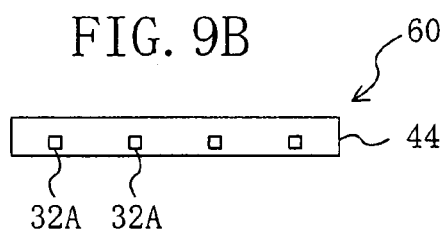
Figure 9D:
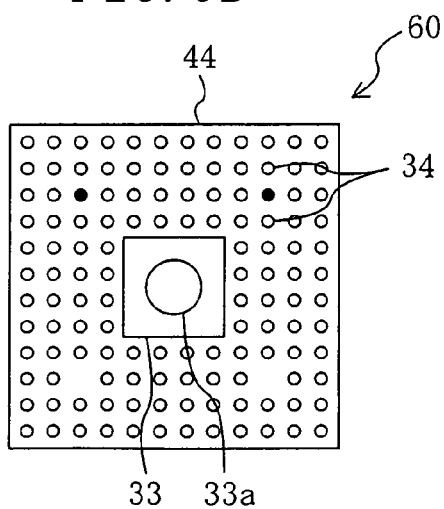

The device 60 of the fourth embodiment shown in FIGS. 9A through 9D uses a leadframe with a structure similar to that of the leadframe 30 of the third embodiment shown in FIGS. 7A and 7B. As shown in FIG. 9D, the leadframe of the device 60 includes inner leads 34 arranged in four rows along each side of the die pad 33.

Although not shown, the device 60 also includes semiconductor chip, metal fine wires and resin encapsulant 44. The chip has been bonded to, and fixed on, the die pad 33 of the leadframe with a silver paste. The wires may also be made of gold (Au) and used to electrically connect the external terminals of the chip to the inner leads 34.

The resin encapsulant 44 may be a thermosetting resin, for example, and used to mold the chip, die pad 33 and inner leads 34 together so as to expose the respective tops of the convex portions of the leads 34 and the bottom of the die pad 33.

Hereinafter, it will be described how to manufacture the resin-molded semiconductor device 60 with such a structure.

First, as described for the third embodiment, a leadframe 30 with an adhesive tape for use to prevent the isolated leads from dropping off is prepared. At this stage, the leadframe 30 includes multiple die pads 33 and multiple sets of inner leads 34 for a plurality of semiconductor chips. In this process step, the tape may be attached to the lower and/or upper surfaces of the leadframe 30.

Next, a die bonding process step is performed. Specifically, the semiconductor chips are bonded onto the upper surface of the die pads 33 of the leadframe 30 with a silver paste.

Then, a wire bonding process step is performed. That is to say, the external terminals of each of the semiconductor chips are electrically connected to the associated inner leads 34 using wires.

Thereafter, a resin molding process step is carried out. Where the adhesive tape 20 has been attached onto parts of the upper surface of the leadframe 30 on which the chips have been mounted, the tape 20 is removed from the upper surface either by peeling it off-or chemically dissolving it. Then, the chips, die pads 33 and inner leads 34 are molded together with a resin encapsulant 44 so that the top of the convex portions of the inner leads 34 and the bottom of the die pads 33 are exposed on the back surface of the resin encapsulant 44.

Subsequently, a dicing process step is carried out. Specifically, where the adhesive tape 20 has been attached to bottom of the leadframe 30, the tape 20 is removed from the bottom by peeling it off or chemically dissolving it. Then, the assembly, including the semiconductor chips and leadframe 30 that have been molded together with the resin encapsulant 44, is diced into respective packages using a dicing blade, for example, so that each package includes at least one of the chips.

By performing these process steps, the resin-molded semiconductor device 60 shown in FIGS. 9A through 9D is completed.

As shown in FIG. 9D, the leadframe 30 of the fourth embodiment also includes a concave portion 33a on the bottom thereof. Accordingly, part of the resin encapsulant 44 located under the semiconductor chip has an increased thickness, thus decreasing the difference between the two types of stresses applied down- and upward to the chip through the resin encapsulant 44. As a result, a decreased stress is actually placed on the chip. In addition, the device can also have its waterproofness increased because it takes a long distance for water to enter the chip from the bottom of the resin encapsulant 44 under the die pad 33. Consequently, the semiconductor device can show improved long-term reliability.

Modified Example of Embodiment 4

Hereinafter, a modified example of the fourth embodiment will be described with reference to the accompanying drawings.

FIGS. 10A, 10B, 10C and 10D respectively illustrate plan, front, right side and bottom views of a resin-molded semiconductor device according to a modified example of the fourth embodiment. In FIGS. 10A through 10D, each member also shown in FIGS. 9A through 9D is identified by the same reference numeral and the description thereof will be omitted herein.

Figure 10A:
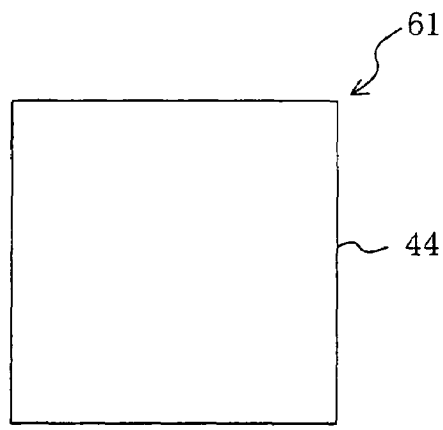
FIGS. 10A, 10B, 10C and 10D are respectively plan, front, right side and bottom views illustrating a resin-molded semiconductor device according to a modified example of the fourth embodiment.
Figure 10C:
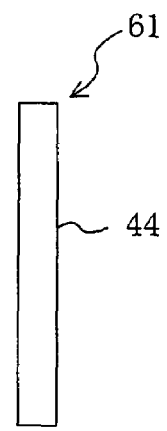
Figure 10B:
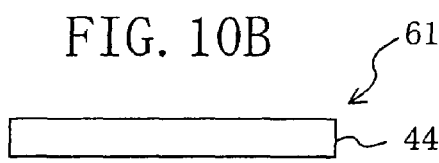
Figure 10D:
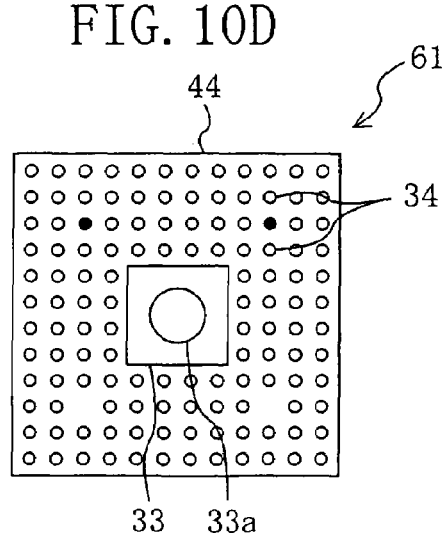

The device 61 of this modified example shown in FIGS. 10A through 10D uses a leadframe with a structure similar to that of the leadframe 30 of the modified example of the third embodiment shown in FIGS. 8A and 8B. As shown in FIG. 10D, the leadframe 61 of the device 61 includes inner leads 34 arranged in four rows along each side of the die pad 33.

Although not shown, the device 61 also includes semiconductor chip, metal fine wires and resin encapsulant 44. The chip has been bonded onto, and fixed on, the die pad 33 of the leadframe with a silver paste. The wires may also be made of gold (Au) and used to electrically connect the external terminals of the chip to the inner leads 34.

The resin encapsulant 44 molds the chip, die pad 33 and inner leads 34 together so as to expose the top of the convex portions of the inner leads 34 and the bottom of the die pad 33.

As shown in FIGS. 10B and 10C, no parts of the leadframe 30 are exposed on the side faces of the resin encapsulant 44 in the device 61 of this modified example. Accordingly, when the device 61 is mounted onto a motherboard, substantially no leakage current will flow through the side faces of the resin encapsulant 44.

Embodiment 5

Hereinafter, a fifth embodiment of the present invention will be described with reference to the accompanying drawings.

Figure 11A:
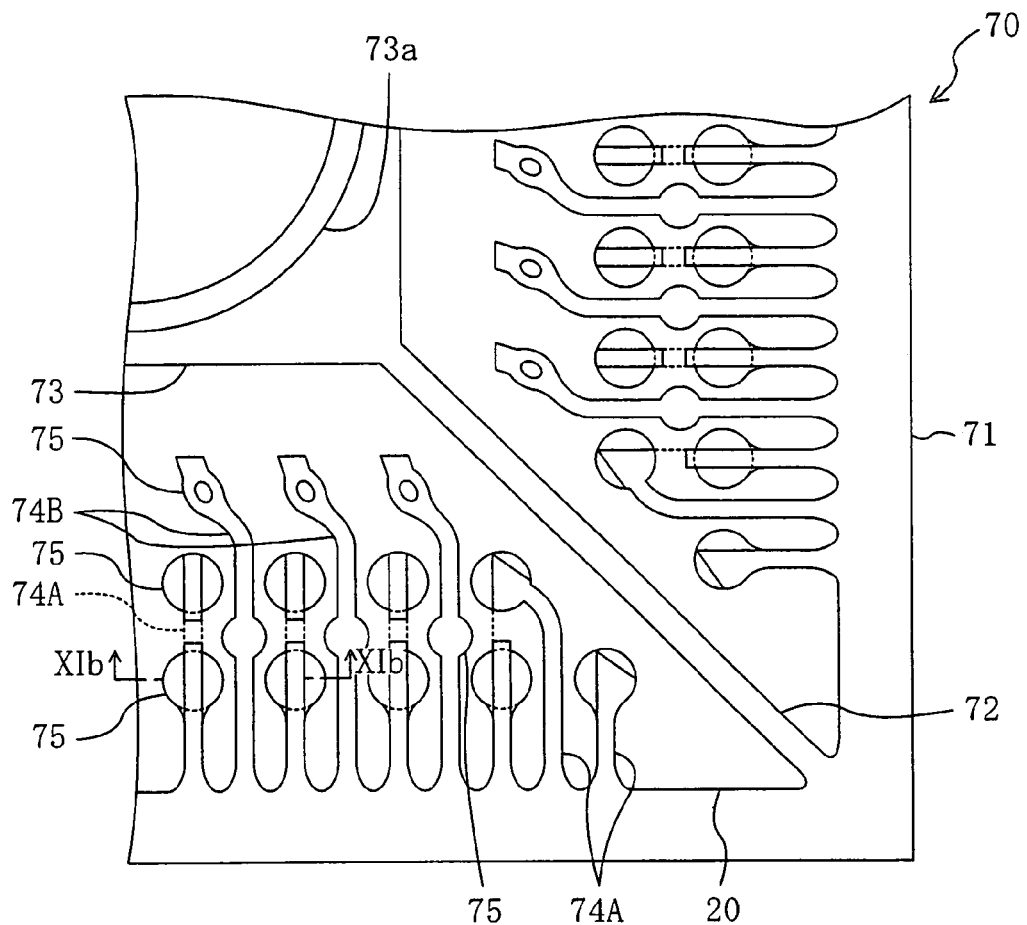
FIG. 11A is a partial plan view illustrating a leadframe according to a fifth embodiment of the present invention after lands have been isolated from each other.

FIG. 11A is a plan view illustrating a quarter of a leadframe 70 according to the fifth embodiment after the lands thereof have been isolated from each other. As shown in FIG. 11A, the leadframe 70 includes lands 75 and inner leads 74B for connecting the lands 75 together.

More specifically, the leadframe 70 includes frame rail 71, support leads 72, die pad 73 and lands 75. The support leads 72 are equivalent to the joining/supporting members as defined in the appended claims. The die pad 73 is supported inside the frame rail 71 by the support leads 72 at the four corners thereof and is used to mount a semiconductor chip on the upper surface thereof. The lands 75 are arranged between the frame rail 71 and the die pad 73. The upper surface of the die pad 73 has a raised portion 73a at the center thereof.

Some of the lands 75 are supported by joining/supporting members 74A extending inward from the frame rail 71. The other lands 75 have already been isolated by a stamping process, for example.

Some of the lands 75 supported by the joining/supporting members 74A are further electrically connected to other lands 75 by way of the inner leads 74B.

The leadframe 70 of the fifth embodiment has two main features. Firstly, like the leadframe of any of the foregoing embodiments, the frame rail 71 and lands 75 of the leadframe 70 are also retained by the adhesive tape 20 (i.e., exemplary lead retaining member) on their bottom, i.e., the back surface of the leadframe 70 opposite to that illustrated in FIG. 11. That is to say, the tape 20 is used to prevent the isolated lands 75 from dropping off the leadframe 70.

Secondly, each of the inner leads 74B located between an associated pair of lands 75 has a specially designed cross-sectional shape.

Normally, the lands 75 are used as electrically isolated ones. However, depending on the specification of a semiconductor device, one of the lands 75 should have its potential level equalized with that of another by connecting these lands 75 together via an inner lead 74B. Nevertheless, if the lands 75 should be arranged at a narrow spacing, it is difficult to provide a sufficient space for the inner lead 74B between the lands 75. In that case, each of those lands 75 or inner leads 74 has to have a decreased width. Then, the lands 75 will make an electrical contact with a motherboard in a decreased total area and the inner leads 74B will have an increased electrical resistance.

Figure 11B:
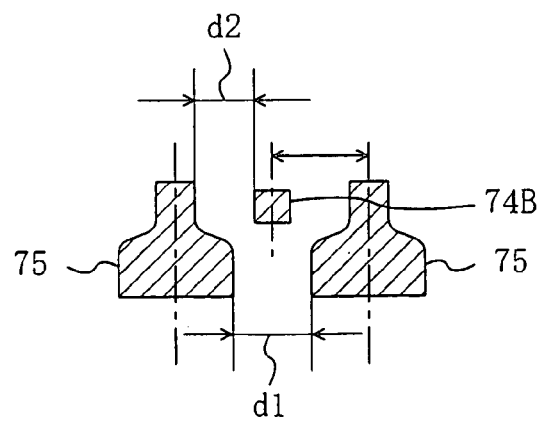
FIG. 11B is a partial cross-sectional view thereof taken along the line XIb—XIb shown in FIG. 11A.
Figure 12:
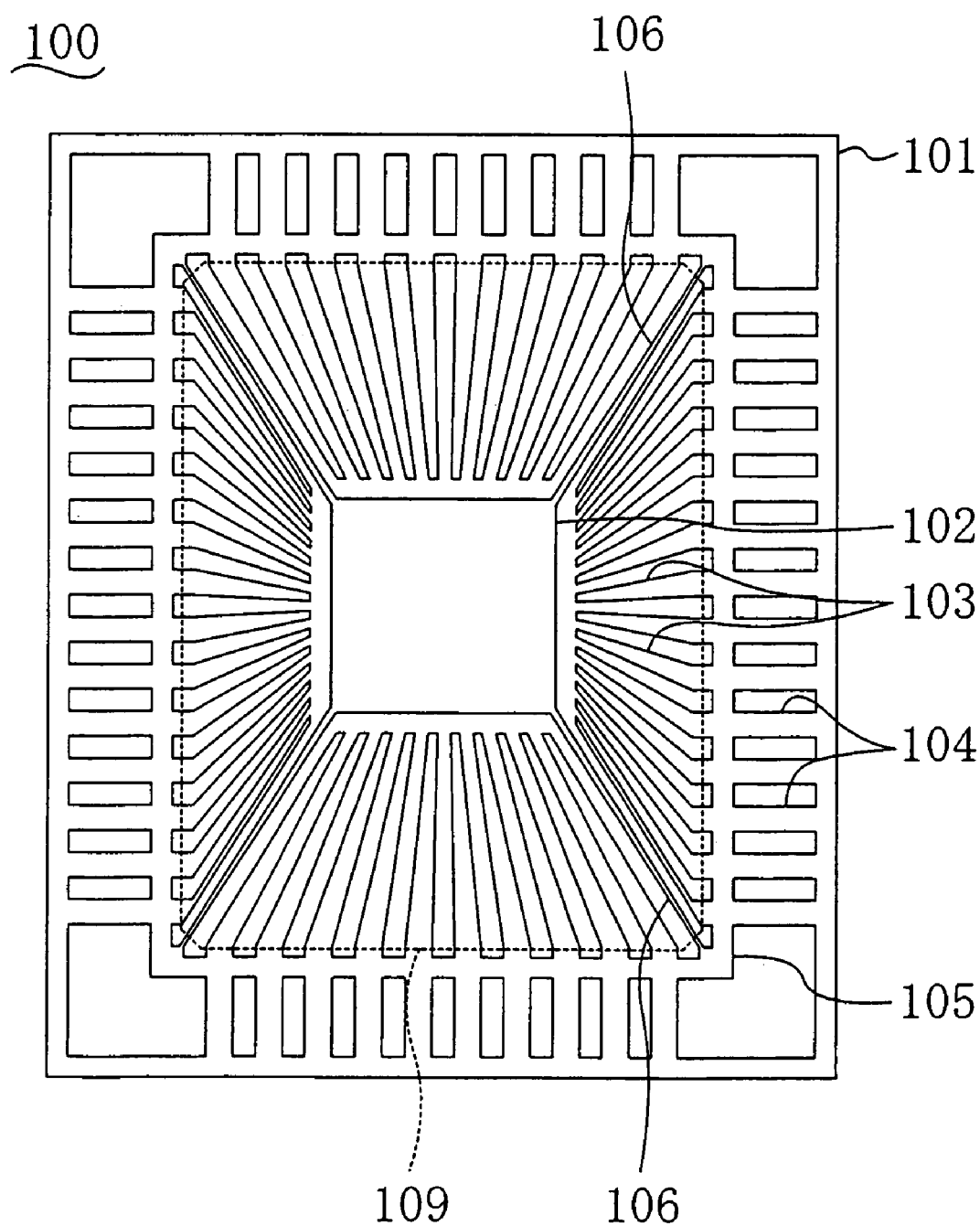
FIG. 12 is a plan view illustrating a known leadframe.
Figure 13:
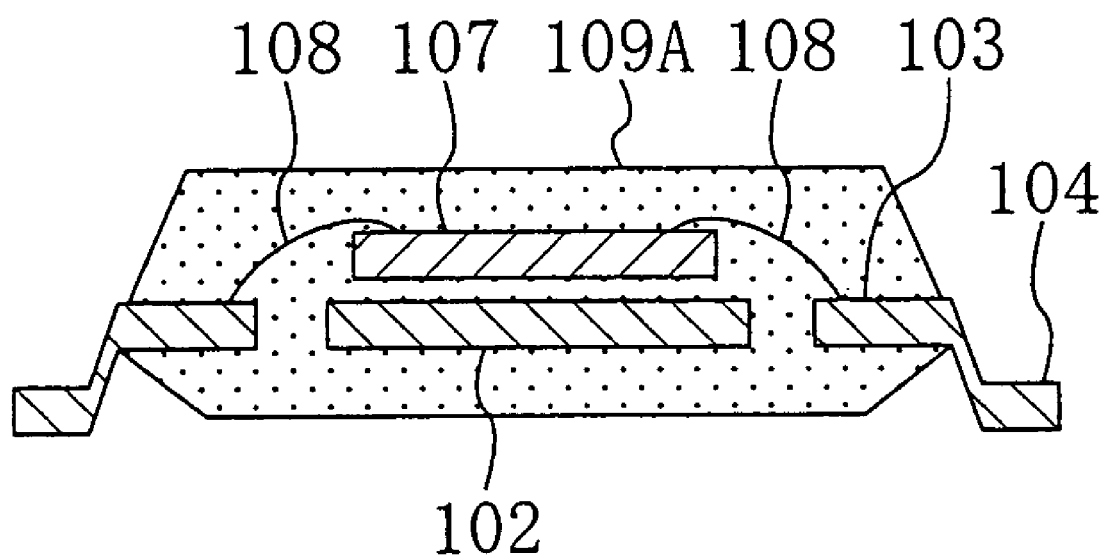
FIG. 13 is a cross-sectional view illustrating a known resin-molded semiconductor device.

Thus, according to the fifth embodiment, the top of each of those inner leads 74B is almost as high as that of an adjacent pair of lands 75 as shown in FIG. 11B. In addition, the bottom of the inner lead 74B is higher than that of the adjacent pair of lands 75 as also shown in FIG. 11B.

Also, when taken vertically to the direction in which the inner leads 74B extend, each of the lands 75 has such a cross-sectional shape that each side face of the land 75, facing a side face of the associated inner lead 74B, decreases its width upward.

According to this embodiment, even if the space d1 between the lands 75 is kept narrow, a sufficient space d2 can be provided between the top of each of these lands 75 and the inner lead 74B. It should be noted that the spaces d1 and d2 may be substantially equal to each other.

As can be seen, the inner lead 74B is located between the respective upper parts of the two adjacent lands 75 that are separated from each other by a space greater than the space d1 between the lower parts thereof. Accordingly, the inner lead 74B can be positioned between the lands 75 without decreasing the width of the lower parts of the lands 75 or that of the inner lead 74B itself.

Next, it will be described how to make the leadframe 70 of the fifth embodiment.

First, a prototype of the leadframe 70 is prepared by shaping (e.g., stamping or etching) a metal plate of an alloy mainly composed of copper (Cu) or an alloy of iron (Fe) and nickel (Ni). The leadframe prototype includes the frame rail 71, die pads 73 and joining/supporting members 74A. Each of the die pads 73 is included in its associated portion of the frame rail 71. Each of the joining/supporting members 74A is connected to either the periphery of the associated die pad 73 or the frame rail 71.

Next, the lands 75 and inner leads 74B are formed by half-etching the joining/supporting members 74A from the upper and lower surfaces thereof.

Specifically, respective parts of the leadframe prototype are etched away from the upper surface thereof, on which the chips will be mounted, to approximately half the thickness thereof. In this process step, other parts of the leadframe prototype, which will be respective center portions of the lands 75 extending in parallel to the associated joining/supporting member 74A, are masked. Still other parts of the leadframe prototype, which will be the inner leads 74B located between the lands 75, are also masked. In this manner, the inner leads 74B and lands 75 are formed out of the joining/supporting members 74A.

Next, other parts of the leadframe prototype are etched from the bottom thereof with the parts of the leadframe prototype to be the lands 75 masked on the bottom so that the lands 75 and the inner leads 74B are isolated from each other. The leadframe prototype is etched until the opening formed between the upper part of each land 75 and the associated joining/supporting member 74A or inner lead 74B becomes continuous with the opening-being formed between the lands 75. As a result, an opening with a Y-cross section is formed between the side faces of each adjacent pair of lands 75 and under the inner lead 74B interposed between the pair of lands 75. It should be noted that the upper and lower parts of the leadframe prototype may be half-etched in reverse order.

Subsequently, the adhesive tape 20 is attached to the bottom of the lands 75 and frame rail 71, thereby retaining the lands 75 and frame rail 71 on the tape 20.

Then, at least some of the joining/supporting members 74A are either partially removed mechanically using the punch shown in FIG. 3C or 4C or partially etched away chemically, thereby selectively isolating the lands 75 or inner leads 74B. Parts of the joining/supporting members 74A to be removed are located between a pair of lands 75 that are adjacent to each other in the direction in which the joining/supporting members 74A extend or between the lands 75 and the die pad 73.

In the illustrated embodiment, the adhesive tape 20 is attached to the entire bottom of the leadframe 70. However, the tape 20 may be attached to either the upper or lower surface of the leadframe 70 so long as the isolated lands 75 can be retained with respect to the die pad 73 or frame rail 71. It should be noted that where the tape 20 is attached to the upper surface of the leadframe 70, the tape 20 should not interfere with the die and wire bonding process steps to be performed on the semiconductor chip.

Also, in the foregoing embodiment, the adhesive tape 20 is used as an exemplary lead retaining member. Alternatively, the lead retaining member may be a metal thin film of aluminum, for example. That is to say, the retaining member may be either electrically insulating or conductive.

To make a resin-molded semiconductor device using the leadframe 70 of the fifth embodiment, the die bonding, wire bonding, resin molding and dicing process steps should be performed sequentially as already described for the second embodiment.

What is claimed is:

1. A resin-molded semiconductor device comprising:

a die pad;

a semiconductor chip bonded onto the die pad;

a plurality of inner leads, which are arranged in three or more columns and rows, between the die pad and one side of the device, to surround the die pad and at least some of which are isolated; and a resin encapsulant that molds the chip, the die pad and the inner leads together so as to expose a surface of the inner leads opposite to a surface of the die pad onto which the chip has been bonded, wherein the die pad and the inner leads are made of a single metal plate, and each of said inner leads has an upper surface and a lower surface, the upper surface being on the same side as the surface of the die paid onto which the chip has been bonded, and the lower surface projecting from the surface of the inner lead opposite to the surface of the die pad onto which the chip has been bonded and exposing from the resin encapsulant, a burred portion is formed on the periphery of the upper surface in a vertical direction with respect to the upper surface, and a top of the burred portion is not exposed from the resin encapsulant.

2. The device of claim 1, wherein the die pad has a concave portion on the bottom thereof.

3. The device of claim 1, wherein none of the inner leads is exposed out of the side faces of the resin encapsulant.

4. The device of claim 1, wherein each said inner lead has at least one said burred portion hanging down perpendicularly from a level surface of the inner lead, and a lowermost part of each burred portion is located between the upper surface and the lower surface of the inner lead and is molded in the encapsulant.

* * * * *